US012131973B2

(12) United States Patent
Yu et al.

(10) Patent No.: US 12,131,973 B2
(45) Date of Patent: Oct. 29, 2024

(54) SEMICONDUCTOR DEVICE AND METHOD FORMING THE SAME

(71) Applicant: Vanguard International Semiconductor Corporation, Hsinchu (TW)

(72) Inventors: Hsiu-Mei Yu, Hsinchu (TW); Guang-Yuan Jiang, Hsinchu (TW); Cheng-Yi Hsieh, Jhubei (TW); Wei-Chan Chang, Taoyuan (TW); Chang-Sheng Lin, Jhunan Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 204 days.

(21) Appl. No.: 17/847,632

(22) Filed: Jun. 23, 2022

(65) Prior Publication Data

US 2023/0420328 A1    Dec. 28, 2023

(51) Int. Cl.
*H01L 23/367*    (2006.01)
*H01L 21/02*    (2006.01)
*H01L 21/28*    (2006.01)
*H01L 21/48*    (2006.01)

(52) U.S. Cl.
CPC .... *H01L 23/3672* (2013.01); *H01L 21/02266* (2013.01); *H01L 21/28194* (2013.01); *H01L 21/4828* (2013.01)

(58) Field of Classification Search
None
See application file for complete search history.

(56) References Cited

U.S. PATENT DOCUMENTS

| | | | |
|---|---|---|---|
| 10,163,707 B2 | 12/2018 | Chang et al. | |
| 11,211,308 B2 | 12/2021 | Chiu et al. | |
| 11,527,606 B2 * | 12/2022 | Chou | H01L 29/408 |
| 2008/0303154 A1 * | 12/2008 | Huang | H01L 23/53238 |
| | | | 438/643 |
| 2016/0005816 A1 | 1/2016 | Kim et al. | |
| 2016/0049378 A1 | 2/2016 | Song et al. | |
| 2018/0012770 A1 | 1/2018 | Macelwee et al. | |
| 2020/0403090 A1 * | 12/2020 | Lin | H01L 29/41766 |
| 2021/0225770 A1 * | 7/2021 | Lin | H01L 21/31144 |

(Continued)

FOREIGN PATENT DOCUMENTS

TW    202123468 A    6/2021

OTHER PUBLICATIONS

Taiwanese Office Action and Search Report for corresponding Taiwanese Application No. 111112374, dated Jan. 5, 2023.

*Primary Examiner* — Alexander G Ghyka
(74) *Attorney, Agent, or Firm* — Birch, Stewart, Kolasch & Birch, LLP

(57) ABSTRACT

A semiconductor device includes: a substrate; a seed layer disposed on the substrate; a compound semiconductor stack layer disposed on the seed layer; and a source metal layer and a drain metal layer disposed on the compound semiconductor stack layer. The semiconductor device further includes a conductive layer at least partially covering the source metal layer and the drain metal layer, and covering opposing side surfaces of the seed layer and opposing side surfaces of the compound semiconductor stack layer. The conductive layer electrically connects the seed layer and the source metal layer.

12 Claims, 26 Drawing Sheets

(56) References Cited

U.S. PATENT DOCUMENTS

2022/0208992 A1\* 6/2022 Chou ................ H01L 29/66462
2023/0170389 A1\* 6/2023 Lin ................... H01L 29/41766
　　　　　　　　　　　　　　　　　　　　257/76

\* cited by examiner

SEMICONDUCTOR DEVICE AND METHOD FORMING THE SAME

BACKGROUND

Technical Field

The present disclosure is related to a semiconductor device and method forming the same, and in particular it is related to a conductive layer of a high electron mobility transistor (HEMT) and method forming the same.

Description of the Related Art

Gallium nitride (GaN)-based semiconductor materials have many extraordinary material characteristics, such as high heat resistance, wide band-gap, and high electron saturation rate. Therefore, GaN-based semiconductor materials are suitable for high-temperature, high-voltage, or high-current environments. In recent years, GaN-based materials have been widely applied in light-emitting diode (LED) devices or high-frequency devices, such as high electron mobility transistors (HEMT) having heterojunction structures.

Even though the high electron mobility transistors have many advantages, the high electron mobility transistors known in the art still have many issues with large current and high voltage, and these issues need to be addressed. For example, during operation of a high electron mobility transistor, excessive charges may accumulate in the seed layer located at the lower level of the device structure due to its material characteristics. Under such circumstances, the charges that accumulate may impact the normal operation of the device.

SUMMARY

In view of the above, it is necessary to propose an improved high electron mobility transistor to address existing defects within the known high electron mobility transistors.

In an embodiment, a semiconductor device includes: a substrate; a seed layer disposed on the substrate; a compound semiconductor stack layer disposed on the seed layer; and a source metal layer and a drain metal layer disposed on the compound semiconductor stack layer. The semiconductor device further includes a conductive layer at least partially covering the source metal layer and the drain metal layer, and covering opposing side surfaces of the seed layer and opposing side surfaces of the compound semiconductor stack layer. The conductive layer electrically connects the seed layer and the source metal layer.

In another embodiment, a method forming a semiconductor device includes: providing a substrate; forming a seed layer on the substrate; forming a compound semiconductor stack layer on the seed layer; and forming a source metal layer and a drain metal layer on the compound semiconductor stack layer. The method also includes performing a dicing process to form a dicing opening through the compound semiconductor stack layer and the seed layer, and extending into at least a portion of the substrate. The method further includes: conformally depositing a conductive layer on a bottom and sidewalls of the dicing opening, and covering the source metal layer and the drain metal layer; and removing a portion of the conductive layer located between the source metal layer and the drain metal layer.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
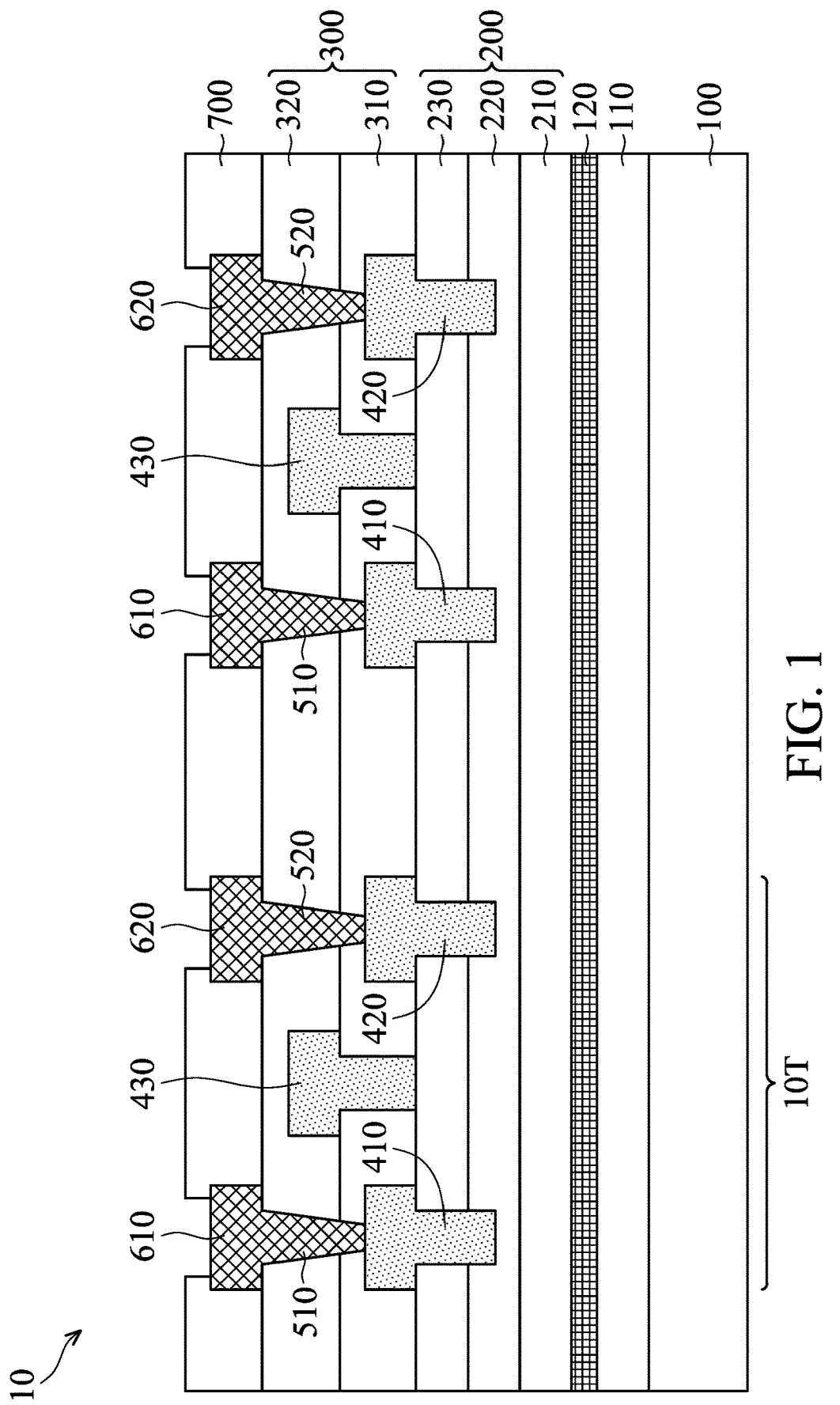
FIGS. 1-4, 5A, 6A, 7A, 8A, 9A, 10A, 11A, 12A, 13A, 14A, and 15A illustrate various cross-sectional views of a method forming a semiconductor device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity, and does not in itself dictate a relationship between various embodiments and/or configuration discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Furthermore, spatially relative terms, such as "beneath," "below," "lower," "on," "above," "upper," and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value, and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Some embodiments of the disclosure are described. Additional operations can be provided before, during, and/or after the stages described in these embodiments. Additional features can be added to the semiconductor device structure. Some of the features described below can be replaced or eliminated for different embodiments. Although some embodiments are discussed with operations performed in a particular order, these operations may be performed in another logical order.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

FIGS. 1-4, 5A, 6A, 7A, 8A, 9A, 10A, 11A, 12A, 13A, 14A, and 15A illustrate various cross-sectional views of a method forming a semiconductor device 10 and a package apparatus 1000 thereof, according to some embodiments of the present disclosure. In some embodiments, based on the fields of application, the semiconductor device 10 may include any number of active components and passive components. For simplicity, FIG. 1 only illustrates two transistors 10T arranged adjacent to each other. According to some embodiments of the present disclosure, the transistor 10T may be a high electron mobility transistor (HEMT). The package apparatus 1000 may function as a carrier for at least one singulated transistor 10T.

Referring to FIG. 1, the semiconductor device 10 may include a substrate 100, a buried oxide layer 110, a seed layer 120, a compound semiconductor stack layer 200, a dielectric layer 300, a source electrode 410, a drain electrode 420, a gate electrode 430, a source contact 510, a drain contact 520, a source metal layer 610, a drain metal layer 620, and a passivation layer 700. In some embodiments, the compound semiconductor stack layer 200 may include a buffer layer 210, a channel layer 220, and a barrier layer 230. Moreover, the dielectric layer 300 may include a first dielectric layer 310 and a second dielectric layer 320. Every source electrode 410, every drain electrode 420, and every gate electrode 430 disposed between the source electrode 410 and the drain electrode 420 may constitute the transistor 10T of the present disclosure, such as the high electron mobility transistor. In some embodiments, the film thickness of the semiconductor device 10 excluding the substrate 100 may be approximately from 1 μm to 25 μm.

Referring to FIG. 1, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

In a specific embodiment of the present disclosure, the substrate 100 may have active regions (not shown) and isolation regions (not shown). In some embodiments, the substrate 100 may include a ceramic substrate or a silicon substrate. In some embodiments, the substrate 100 may be an insulating substrate. In some embodiments, materials of the ceramic substrate may include aluminum nitride (AlN), silicon carbide (SiC), aluminum oxide ($Al_2O_3$), the like, or a combination thereof. In some embodiments, the aforementioned ceramic substrate may be formed by high-temperature sintering the ceramic powder using the powder metallurgy.

Still referring to FIG. 1, the buried oxide (BOX) layer 110 may be formed on the substrate 100. In some embodiments, the buried oxide layer 110 may encapsulate the substrate 100, and may be a film of superior thermal stability under high temperature. Materials of the buried oxide layer 110 may include silicon oxide, for example, the buried oxide layer 110 may be an oxidized seed layer made of tetra ethyl ortho silicate (TEOS). The thickness of the buried oxide layer 110 may be approximately between 0.5 μm and 5 μm.

Referring to FIG. 1, the seed layer 120 may be formed on the buried oxide layer 110. In some embodiments, the seed layer 120 may alleviate the lattice mismatch between the substrate 100 and the overlying film layers to enhance the lattice quality. In other embodiments, the substrate 100, the buried oxide layer 110, and the seed layer 120 nay be collectively considered as a semiconductor on insulator (SOI) substrate. The semiconductor on insulator substrate may include a base plate (such as the substrate 100), a buried oxide layer (such as the buried oxide layer 110) disposed on the base plate, and a semiconductor layer (such as the seed layer 120) disposed on the buried oxide layer. Furthermore, the semiconductor on insulator substrate may be an n-type conductive type and a p-type conductive type (for example, the seed layer 120 is doped with phosphorous to form the n-type conductive type, or the seed layer 120 is doped with boron to form the p-type conductive type). The thickness of the seed layer 120 may be approximately between 50 nm and 500 nm, for example, 250 nm. The seed layer 120 may be formed by epitaxial process, which may include metal organic chemical vapor deposition (MOCVD), hydride vapor phase epitaxy (HVPE), molecular beam epitaxy (MBE), the like, or a combination thereof.

Still referring to FIG. 1, the compound semiconductor stack layer 200 may be formed on the seed layer 120. In some embodiments, the seed layer 120 and the compound semiconductor stack layer 200 may be considered as the epitaxial material layers of the semiconductor device 10. According to some embodiments of the present disclosure, the thickness of the compound semiconductor stack layer 200 may be twice or three times larger than the thickness of the seed layer 120. As mentioned previously, the compound semiconductor stack layer 200 may include the buffer layer 210, the channel layer 220, and the barrier layer 230. In some embodiments, the buffer layer 210 may be disposed on and in direct contact with the seed layer 120. The channel layer 220 may be disposed on the buffer layer 210. Next, the barrier layer 230 may be disposed on the channel layer 220. Materials of the compound semiconductor stack layer 200 may include gallium nitride, aluminum nitride, aluminum gallium nitride (AlGaN), aluminum indium nitride (AlInN), the like, or a combination thereof. In a specific embodiment of the present disclosure, the compound semiconductor stack layer 200 may be a GaN-based material. The thickness of the compound semiconductor stack layer 200 may be approximately between 2 μm and 10 μm, for example, 5.5 μm. The compound semiconductor stack layer 200 may be formed by metal organic chemical vapor deposition, atomic layer deposition (ALD), molecular beam epitaxy, liquid phase epitaxy (LPE), the like, or a combination thereof.

According to some embodiments, the buffer layer 210 may alleviate the strain of the overlying channel layer 220 that will be subsequently formed on the buffer layer 210 to prevent the formation of defects in the overlying channel layer 220. The strain may be caused by a mismatch between the channel layer 220 and the underlying film layers. According to some embodiments, the channel layer 220 may provide an electron transmitting path between the source electrode 410 and the drain electrode 420 (described in detail below) of the transistor 10T. In some embodiments, the channel layer 220 may be doped (for example, with n-type dopants or p-type dopants) or undoped.

Referring to FIG. 1, the dielectric layer 300 may be formed on the compound semiconductor stack layer 200. As mentioned previously, the dielectric layer 300 may include the first dielectric layer 310 and the second dielectric layer 320. Even though the dielectric layer 300 of the present disclosure is illustrated as having two dielectric layers, but the present disclosure is not limited thereto. For example, the dielectric layer 300 may include any number of dielectric layers, depending on application and design requirements. In some embodiments, besides providing protection and insulation for underlying film layers, the dielectric layer 300 may also isolate conductive materials of different levels. In some embodiments, materials of the dielectric layer 300 may include silicon oxide (SiO), silicon nitride (SiN), silicon carbide, silicon oxynitride (SiON), silicon oxynitrocarbide ($SiO_xN_yC_{1-x-y}$, wherein x and y are in a range from 0 to 1), tetra ethyl ortho silicate, undoped silicate glass, or doped silicon oxide (such as boron-doped phosphosilicate glass (BPSG), fused silica glass (FSG), phosphosilicate glass (PSG), boron doped silicon glass (BSG)), low-k dielectric materials, or the like. The dielectric layer 300 may be formed by deposition or the like.

Still referring to FIG. 1, before forming the dielectric layer 300, multiple openings may first be formed through the barrier layer 320 and extending into the channel layer 220. The source electrode 410 and the drain electrode 420 are formed on the compound semiconductor stack layer 200, and filled into the openings. According to some embodiments of the present disclosure, the source electrode 410 and the drain electrode 420 may penetrate the barrier layer 230, and may extend into the channel layer 220 to form ohmic contacts. Next, the first dielectric layer 310 of the dielectric layer 300 may first be formed, so the source electrode 410 and the drain electrode 420 are embedded therein. Openings (not shown) may be formed again through the first dielectric layer 310 and exposing a partial surface of the barrier layer 230. The gate electrode 430 is formed on the first dielectric layer 310. According to some embodiments of the present disclosure, the gate electrode 430 may penetrate the first dielectric layer 310, and may sit on the barrier layer 230 to form a Schottky contact. After that, the second dielectric layer 320 of the dielectric layer 300 may be formed, so the gate electrode 430 is embedded therein.

In some embodiments, materials of the source electrode 410, the drain electrode 420, and the gate electrode 430 may include amorphous silicon, polysilicon, poly-SiGe, metal nitride (such as titanium nitride (TiN), tantalum nitride (TaN), tungsten nitride (WN), titanium aluminum nitride (TiAlN), or the like), metal silicide (such as nickel silicide (NiSi), cobalt silicide (CoSi), tantalum silicon nitride (TaSiN), or the like), metal carbide (such as tantalum carbide (TaC), tantalum carbonitride (TaCN), or the like), metal oxide, or metals. Metals may include cobalt (Co), ruthenium (Ru), aluminum (Al), tungsten (W), copper (Cu), titanium (Ti), tantalum (Ta), silver (Ag), gold (Au), nickel (Ni), the like, a combination thereof, or a multiple layer thereof. In some embodiments, the aforementioned openings may be formed in the barrier layer 230 or the first dielectric layer 310 using lithography process (such as photoresist coating, soft baking, exposure, post-exposure baking, development, the like, or a combination thereof), etching process (such as wet etch process, dry etch process, the like, or a combination thereof), the like, or a combination thereof. Next, the aforementioned materials are filled into the openings to form the source electrode 410, the drain electrode 420, and the gate electrode 430.

Referring to FIG. 1, multiple openings (not shown) may be formed through the second dielectric layer 320, and extended into the first dielectric layer 310 to expose the top surface of the source electrode 410 and the top surface the drain electrode 420. The source contact 510 and the drain contact 520 are formed in the openings to contact the source electrode 410 and the drain electrode 420, respectively. Materials of the source contact 510 and the drain contact 520 may be similar to those of the source electrode 410, the drain electrode 420, and the gate electrode 430, and the details are not described again herein to avoid repetition. The formation of the source contact 510 and the drain contact 520 may be similar to that of the source electrode 410, the drain electrode 420, and the gate electrode 430, and the details are not described again herein to avoid repetition.

Still referring to FIG. 1, the source metal layer 610 and the drain metal layer 620 may be formed on the second dielectric layer 320 of the dielectric layer 300, and may be electrically connected to the source contact 510 and the drain contact 520, respectively. It is worth noted that the dielectric layer 300 is vertically disposed between the source metal layer 610/the drain metal layer 620 and the compound semiconductor stack layer 200. In other words, the source electrode 410 is electrically coupled to the source metal layer 610 through the source contact 510, and the drain electrode 420 is electrically coupled to the drain metal layer 620 through the drain contact 520. In some embodiments, the source metal layer 610 and the drain metal layer 620 may function as bonding pads for the back-end of line (BEOL) and/or the package process to form the package apparatus 1000. Materials of the source metal layer 610 and the drain metal layer 620 may be similar to those of the source electrode 410, the drain electrode 420, and the gate electrode 430, and the details are not described again herein to avoid repetition. The formation of the source metal layer 610 and the drain metal layer 620 may be similar to that of the source electrode 410, the drain electrode 420, and the gate electrode 430, and the details are not described again herein to avoid repetition.

Referring to FIG. 1, the passivation layer 700 may be covered on the structural surface of the semiconductor device 10. In some embodiments, the passivation layer 700 may provide protection for the underlying film layers. Moreover, the passivation layer 700 may be patterned to expose partial surfaces of the source metal layer 610 and the drain metal layer 620, so the bonding of the back-end of line and/or the package process may be carried out. Materials of the passivation layer 700 may be similar to those of the dielectric layer 300, and the details are not described again herein to avoid repetition. The formation of the passivation layer 700 may be similar to that of the dielectric layer 300, and the details are not described again herein to avoid repetition.

Figure 2:
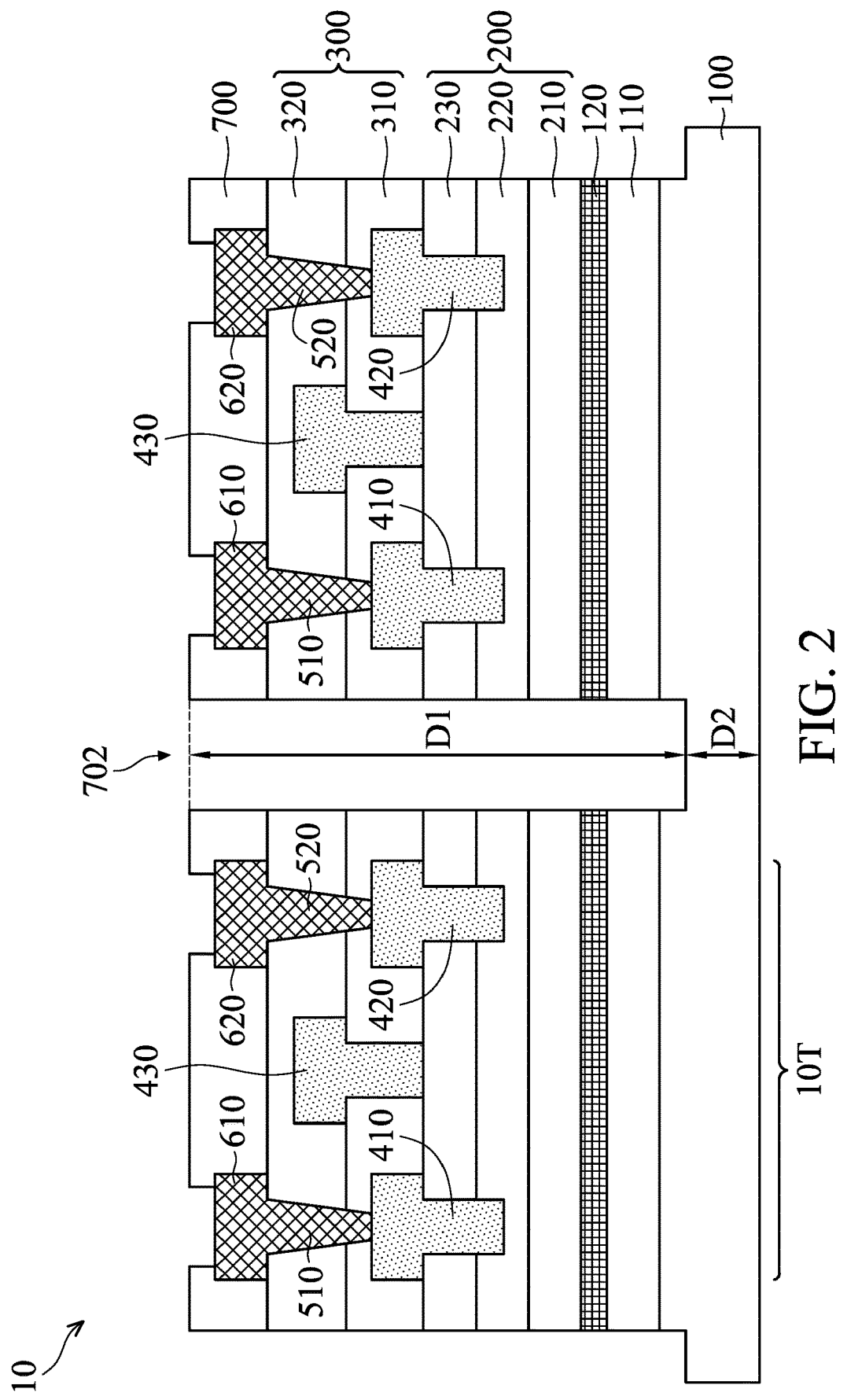

Referring to FIG. 2, a dicing opening 702 is formed corresponding to the location of the subsequent scribe line. The formation of the dicing opening 702 is performed from one side of the source metal layer 610 and the drain metal layer 620 beyond the active region (for example, at the periphery of the two transistors 10T). According to some embodiments of the present disclosure, the laser dicing may preferably be used as the dicing process for forming the dicing opening 702 that exposes side surfaces of the seed layer 120, so the subsequently formed conductive layer 740 (described in detail below) may electrically connect the seed layer 120 to the overlying source metal layer 610, thereby discharging the accumulated charges to lower the resistance and enhance the operation speed of the semiconductor device. In order to electrically connect the seed layer 120, the dicing opening 702 needs to penetrate through the passivation layer 700, the dielectric layer 300, and the compound semiconductor stack layer 200. In one embodiment, the dicing opening 702 may further extend onto the top surface of the substrate 100 or into the substrate 100, to ensure that the side surfaces of the seed layer 120 may be completely exposed. In other words, the dicing opening 702 exposes the side surfaces of the passivation layer 700, the side surfaces of the dielectric layer 300, the side surfaces of the compound semiconductor stack layer 200, the side surfaces of the seed layer 120, the side surfaces of the buried oxide layer 110, and partial side surfaces of the substrate 100.

According to some embodiments of the present disclosure, the dicing opening 702 may have a dicing depth D1, measured from the passivation layer 700 to the bottom of the dicing opening 702. As shown in FIG. 2, the substrate 100 beneath the dicing opening 702 may have a remaining thickness D2. The dicing depth D1 may be approximately between 20 μm and 60 m, for example, 50 μm. The remaining thickness D2 may be approximately between 500 μm and 800 μm. In addition from ensuring the dicing depth D1 can completely expose the seed layer 120, the remaining thickness D2 also needs to remain a certain dimension to make sure that cracks may not be generated in the semiconductor device 10 from the subsequent thinning process.

Figure 3:
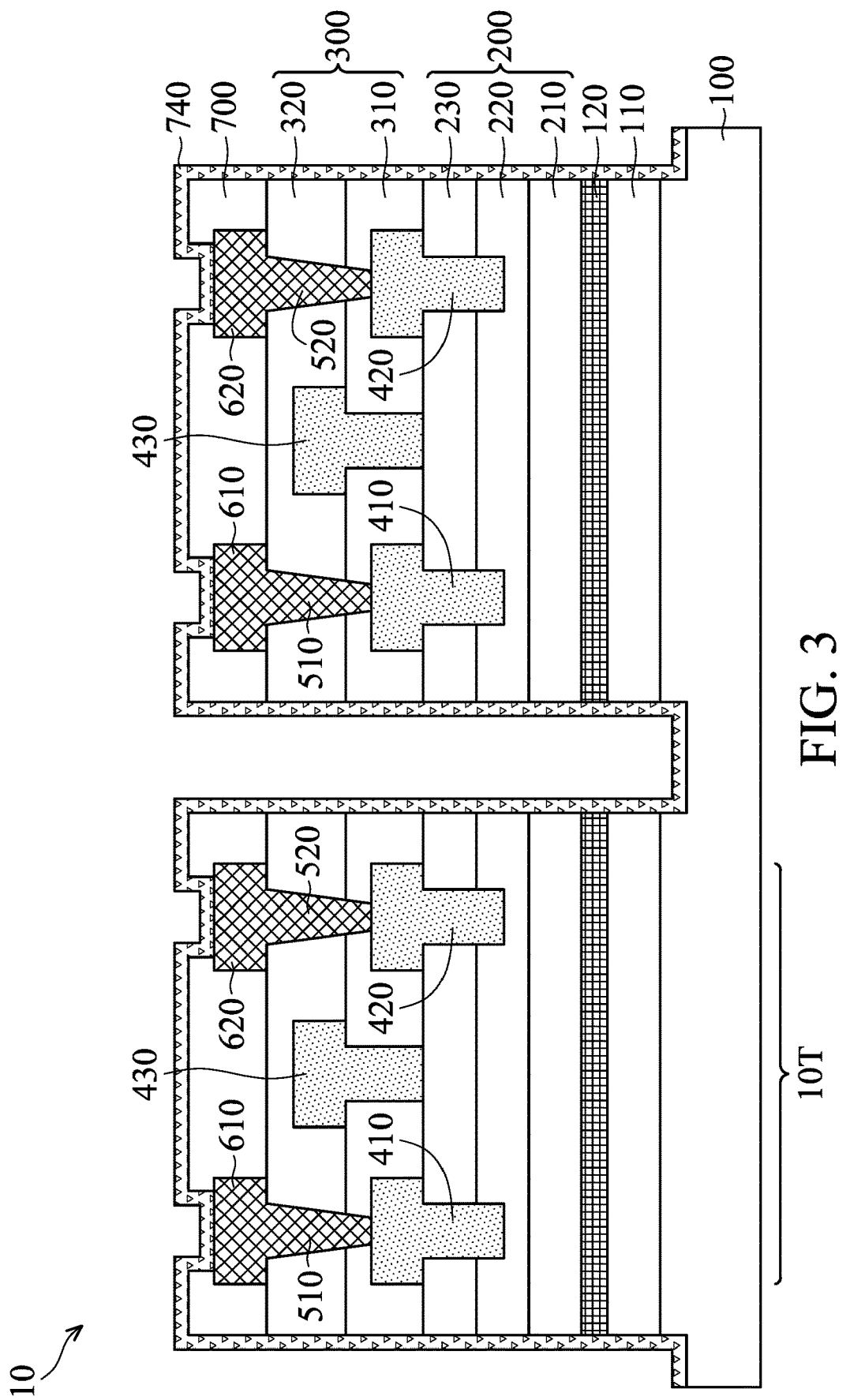

Referring to FIG. 3, a conductive layer 740 may be conformally formed on the structure of the semiconductor device 10, in which the conductive layer 740 covers the passivation layer 700, the exposed surfaces of the source metal layer 610 and the drain metal layer 620, and the sidewalls and the bottom of the dicing opening 702. Since the dicing opening 702 isolates the two transistors 10T from each other, the conductive layer 740 covers the opposing side surfaces of the seed layer 120, the compound semiconductor stack layer 200, and the dielectric layer 300 of every transistor 10T. The conductive layer 740 may electrically connect the seed layer 120 with the source metal layer 610 from the dicing opening 702. According to some embodiments of the present disclosure, the conductive layer 740 is in direct contact with at least one of the opposing side surfaces of the seed layer 120 and the top surface of the source metal layer 610. It is worth noted that, when the conductive layer 740 is first formed, besides electrically connecting the seed layer 120 and the source metal layer 610, the conductive layer 740 also connects the source metal layer 610 and the drain metal layer 620, connects the seed layer 120 and the drain metal layer 620, and connects the neighboring two transistors 10T. Materials of the conductive layer 740 may include titanium, copper, aluminum, cobalt, titanium nitride, tantalum nitride, the like, or a combination thereof. The thickness of the conductive layer 740 may be approximately between 1000 Å and 1 μm, for example, 3000 Å. The conductive layer 740 may be formed by sputtering process, evaporating process, chemical plating, the like, or a combination thereof.

Figure 4:
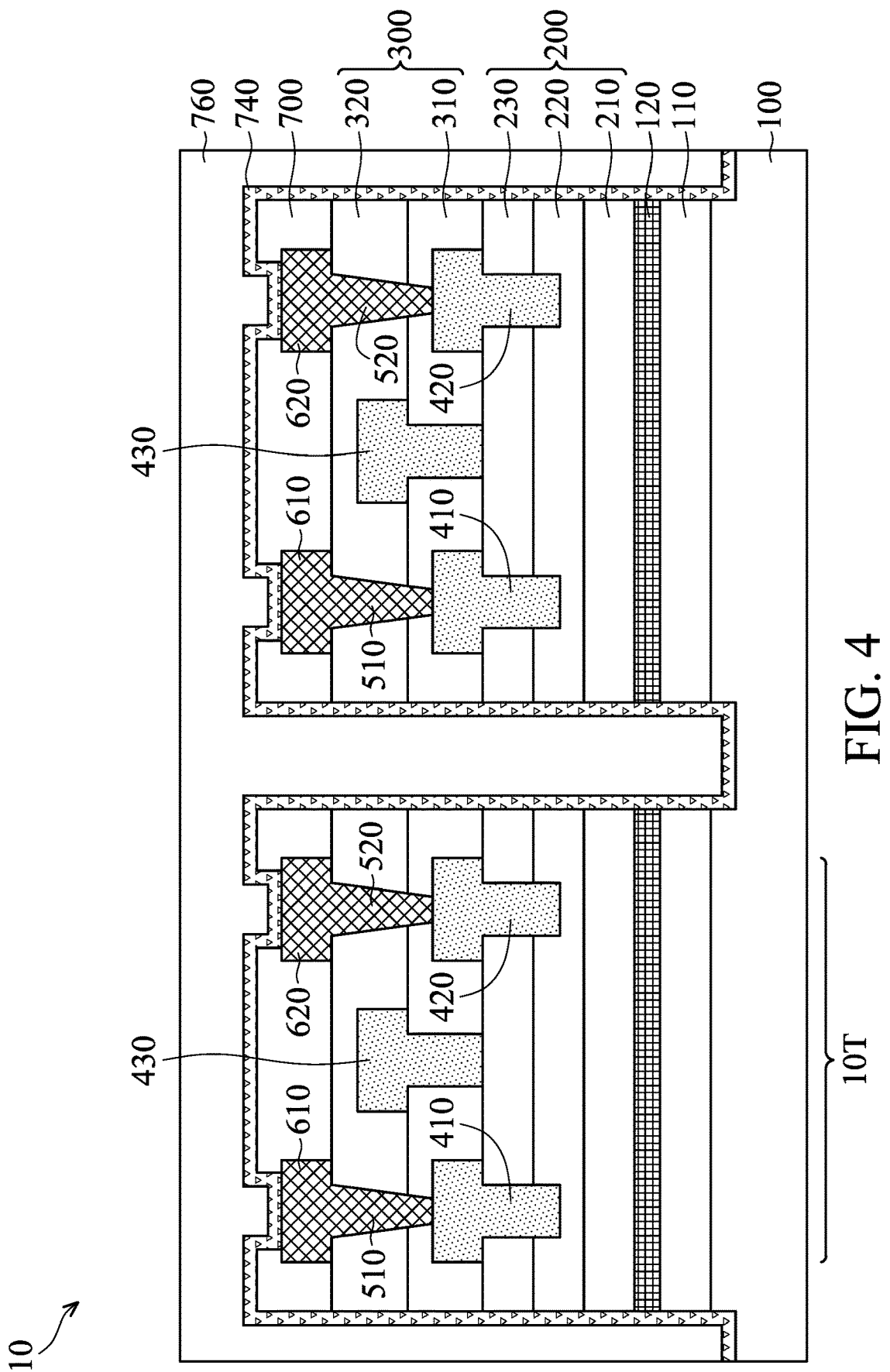

Referring to FIG. 4, the insulating layer 760 is covered on the conductive layer 740. In some embodiments the insulating layer 760 covers the entire semiconductor device 10, fills the dicing opening 702, and has a substantially planarized top surface. The function of the insulating layer 760 is the subsequent patterning of the conductive layer 740, in order to cut off portions of the conductive layer 740 that may cause short circuitry on the semiconductor device 10. Materials of the insulating layer 760 may include polyimide (PI), polyamide (PA), the like, or a combination thereof. The thickness of the insulating layer 760 to the conductive layer 740 may be approximately between 1 μm and 10 m, for example, 3.5 μm. The insulating layer 760 may be formed by spin-on coating, chemical vapor deposition (CVD), atomic layer deposition, high-density plasma chemical vapor deposition (HDP-CVD), plasma-enhanced chemical vapor deposition (PECVD), flowable chemical vapor deposition (FCVD), sub-atmospheric chemical vapor deposition (SACVD), the like, or a combination thereof.

FIGS. 5B, 6B, 7B, 8B, 9B, 10B, 11B, 12B, 13B, 14B, and 15B illustrate various cross-sectional views of a different configuration of the semiconductor device 10 and the package apparatus 1000 thereof, according to other embodiments of the present disclosure. In the embodiment of FIGS. 1-4, 5A, 6A, 7A, 8A, 9A, 10A, 11A, 12A, 13A, 14A, and 15A, the two transistors 10T of the semiconductor device 10 are two active components (for example, the high electron mobility transistors) that are adjacent to each other, but operate independently from each other. In contrast, FIGS. 5B, 6B, 7B, 8B, 9B, 10B, 11B, 12B, 13B, 14B, and 15B illustrate two transistors 10T that are connected with each other in series, wherein the drain metal layer 620 of the two transistors 10T are disposed adjacent to each other. Since the former processes of the embodiment illustrated in FIGS. 5B, 6B, 7B, 8B, 9B, 10B, 11B, 12B, 13B, 14B, and 15B may be similar to those of FIGS. 1-4, the details are not described again herein to avoid repetition.

Figure 5A:
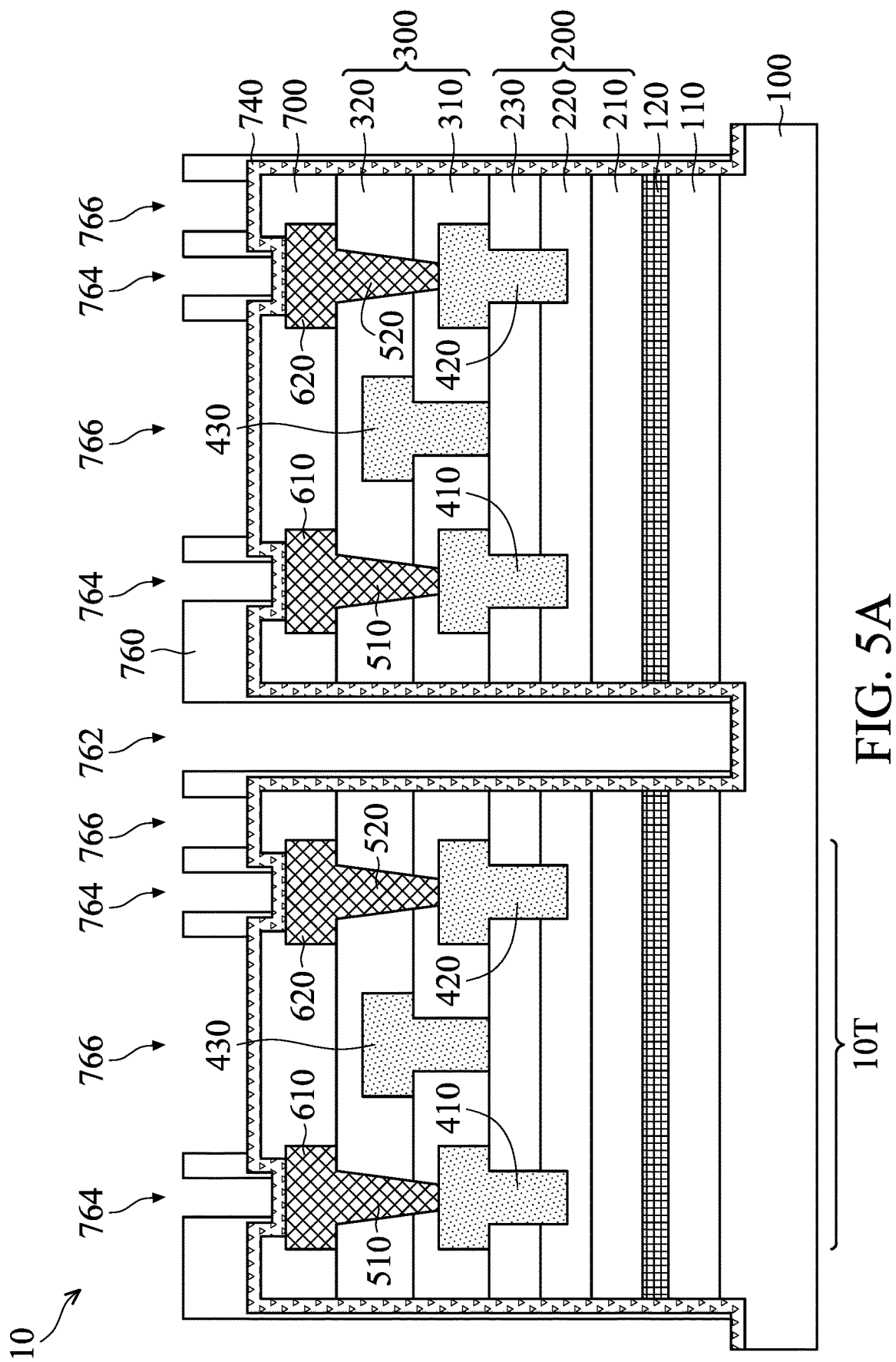
Figure 5B:
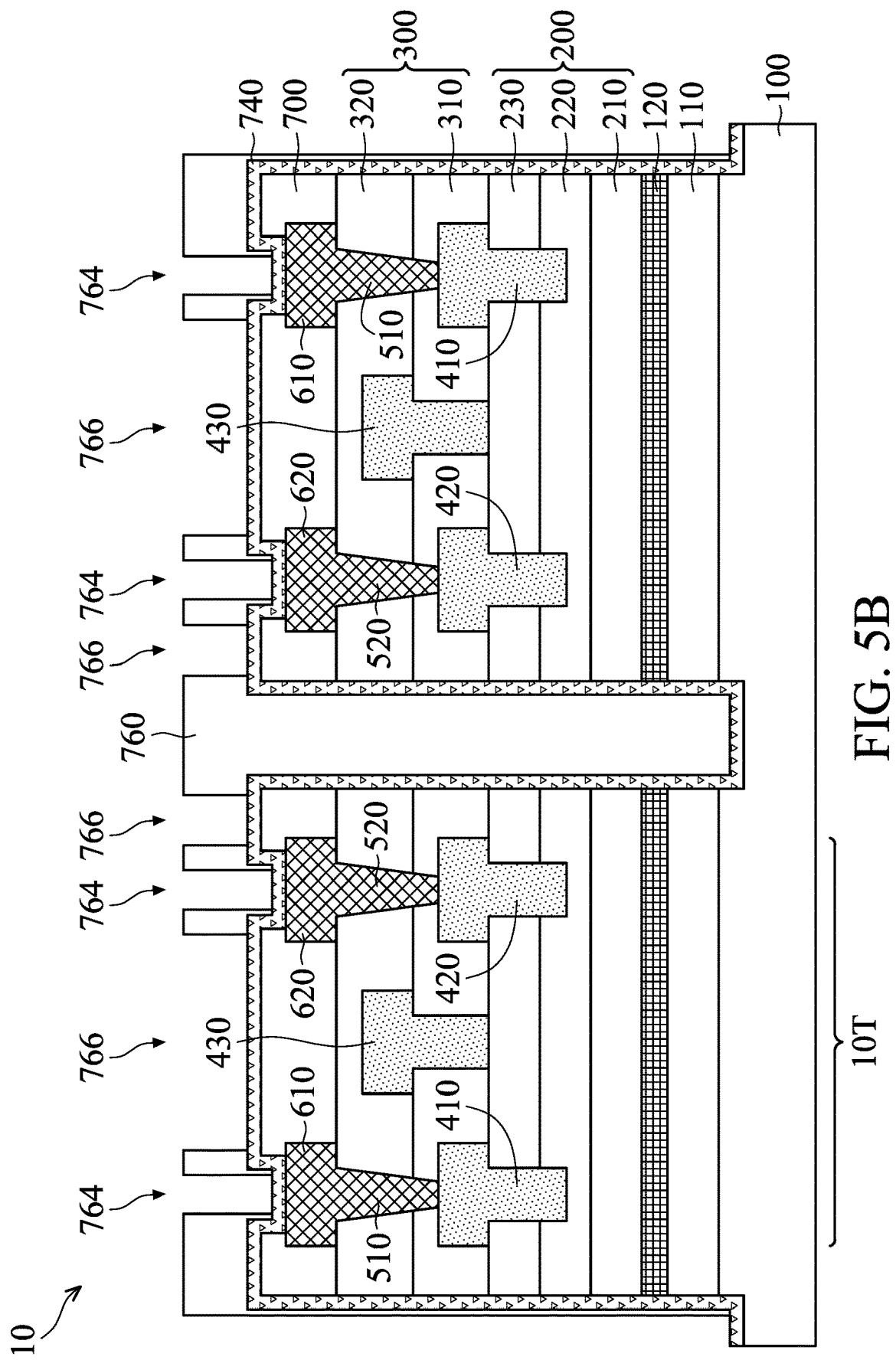
FIGS. 5B, 6B, 7B, 8B, 9B, 10B, 11B, 12B, 13B, 14B, and 15B illustrate various cross-sectional views of a different configuration of the semiconductor device, according to other embodiments of the present disclosure.

Referring to FIGS. 5A and 5B, the insulating layer 760 may be patterned to form a patterned insulating layer 760. After patterning, as shown in FIG. 5A, a first opening 762, a second opening 764, and a third opening 766 may be formed in the insulating layer 760. The first opening 762 exposes the portion of the conductive layer 740 located at the bottom of the dicing opening 702. The second opening 764 exposes the portions of the conductive layer 740 located at the top surface of the source metal layer 610 and the top surface of the drain metal layer 620. The third opening 766 exposes the portion of the conductive layer 740 located between the source metal layer 610 and the drain metal layer 620, and exposes the portion between the drain metal layer 620 and the dicing opening 702 close to the drain metal layer 620. It should be noted that, the portion of the conductive layer 740 between the source metal layer 610 and the dicing opening 702 close to the source metal layer 610 needs to remain covered to realize the innovative method of the present disclosure, which employs the conductive layer 740 to electrically connect the seed layer 120 and the source metal layer 610 to discharge the accumulated charges.

The portions of the conductive layer 740 exposed by the first opening 762 and the third opening 766 of the insulating layer 760 may cause short circuitry of the semiconductor device 10 during operation, thus these portions must be removed in subsequent processes (or the continuous conductive layer 740 needs to be cut off). Furthermore, the portions of the conductive layer 740 exposed by the second opening 764 will not be cut off, instead bonding pads 800 will be formed thereon. In other words, the openings of the insulating layer 760 may be used to cut off the conductive layer 740 (as mentioned above) or to form bonding pads 800. In some embodiments, the first opening 762, the second opening 764, and the third opening 766 may be formed using the lithography process (such as photoresist coating, soft baking, exposure, post-exposure baking, development, the like, or a combination thereof), the etching process (such as wet etch process, dry etch process, the like, or a combination thereof), the like, or a combination thereof.

As shown in FIG. 5B, only the second opening 764 and the third opening 766 are formed in the insulating layer 760. Since the two transistors 10T are connected with each other in series, the insulating layer 760 may not expose the dicing opening 702 between the two transistors 10T. The second opening 764 exposes the portions of the conductive layer 740 located at the top surface of the source metal layer 610 and the top surface of the drain metal layer 620. The third opening 766 exposes the portion of the conductive layer 740 located between the source metal layer 610 and the drain metal layer 620, and exposes the portion between the drain metal layer 620 and the dicing opening 702 close to the drain metal layer 620. As stated earlier, the portion of the conductive layer 740 between the source metal layer 610 and the dicing opening 702 close to the source metal layer 610 needs to remain covered to realize the innovative method of the present disclosure used to discharge the accumulated charges. The formation of the second opening 764 and the third opening 766 may be similar to that of FIG. 5A, and the details are not described again herein to avoid repetition.

Figure 6A:
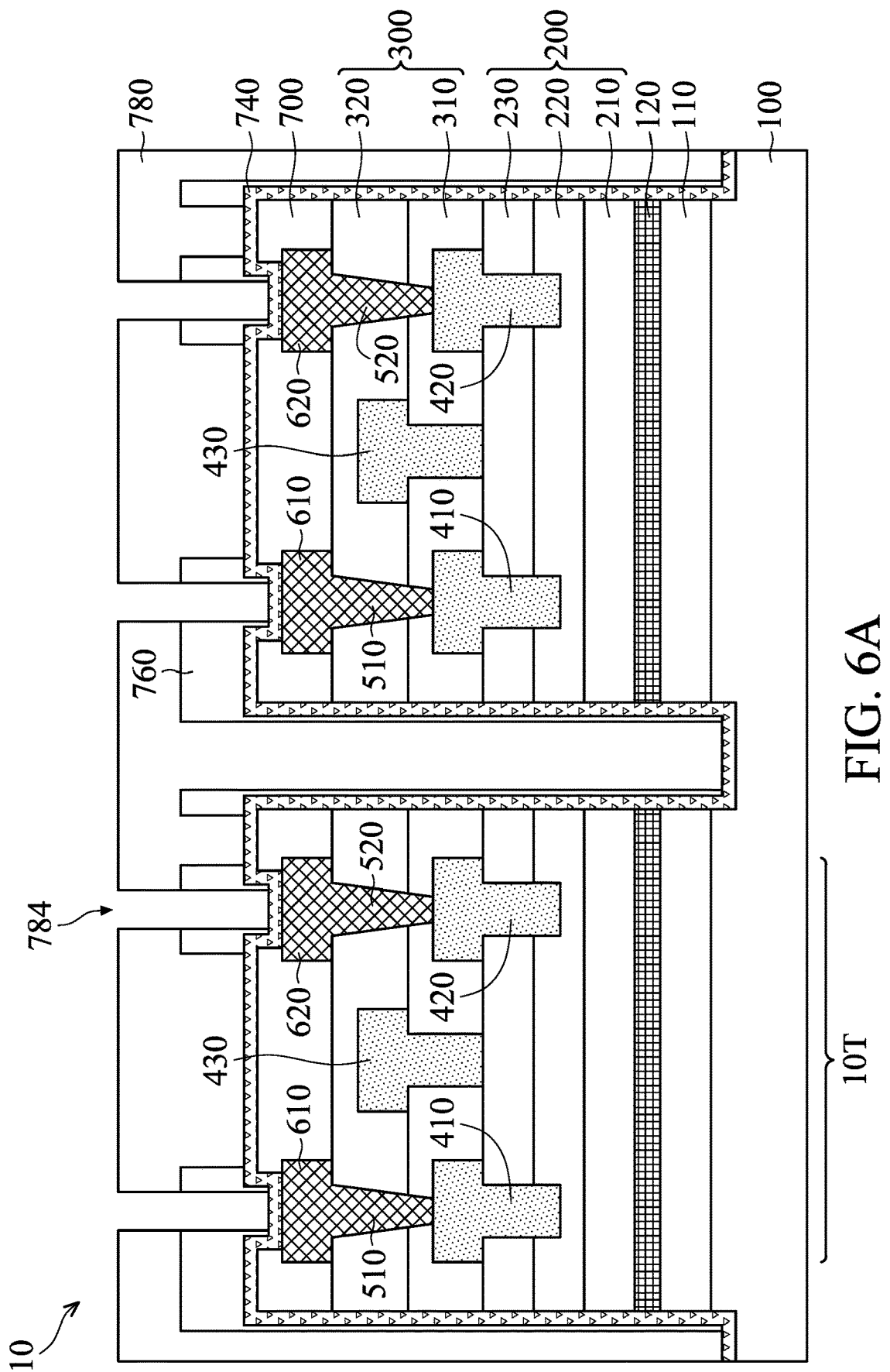
Figure 6B:
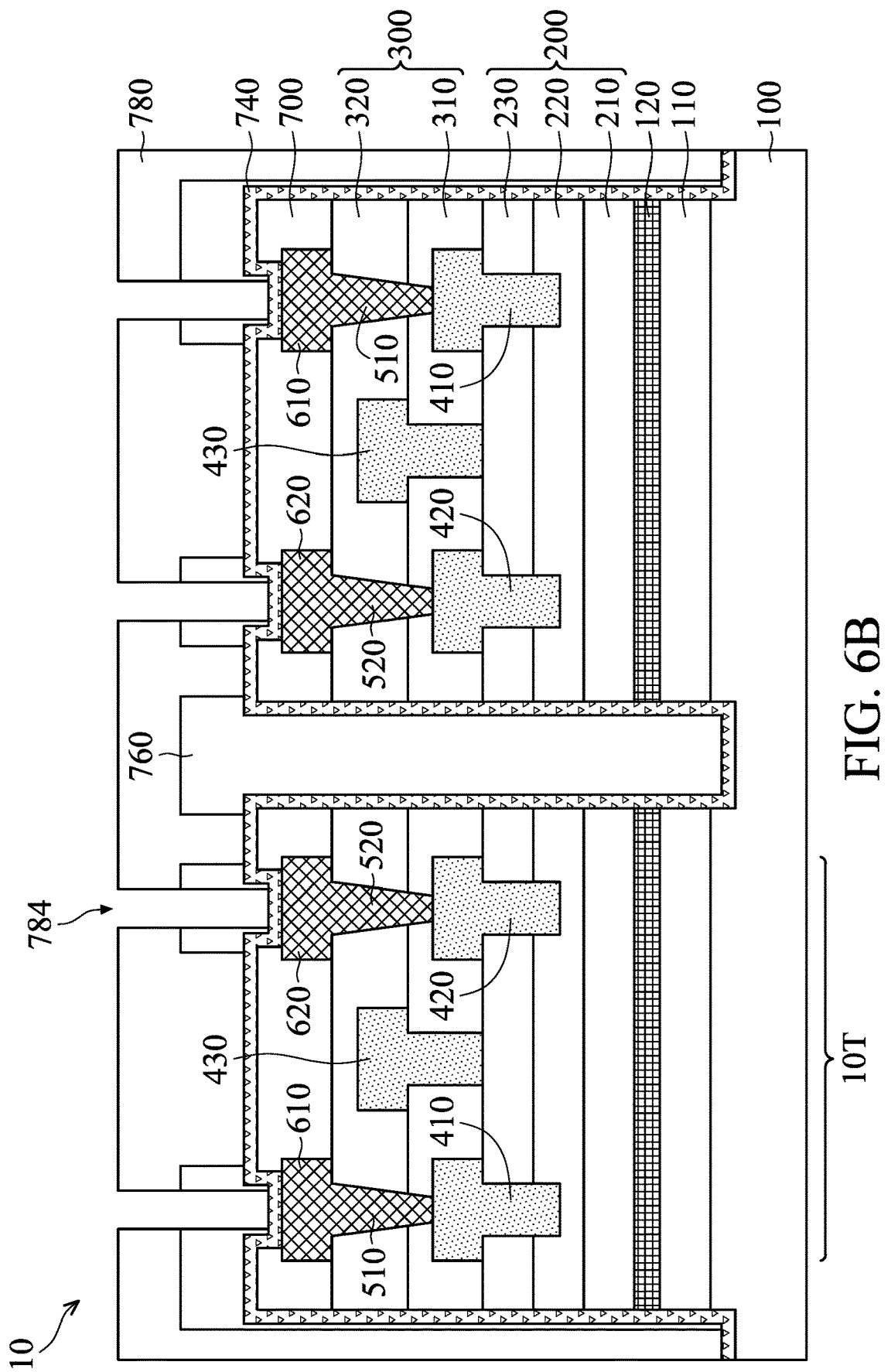

Referring to FIGS. 6A and 6B, a photoresist layer 780 may be formed on the exposed portions of the conductive layer 740 and the patterned insulating layer 760, followed by patterning the photoresist layer 780 to form the photoresist opening 784. The purpose of the patterned photoresist layer 780 is to define the locations of the bonding pads 800 to be formed. It should be appreciated that, the photoresist opening 784 of the photoresist layer 780 corresponds to the second opening 764 of the insulating layer 760, that is, the portions of the conductive layer 740 to be protected by the bonding pads 800 are exposed through the photoresist opening 784 and the second opening 764 to prevent oxidation of the conductive layer 740. It is worth noted that, the photoresist layer 780 may first cover the first opening 762 and the third opening 766 of FIG. 5A (the portions of the conductive layer 740 to be cut off), or may first cover the third opening 766 of FIG. 5B (the portions of the conductive layer 740 to be cut off). It is done so because the portions of the conductive layer 740 causing short circuitry can only be cut off after forming the bonding pads 800. The formation and the patterning of the photoresist layer 780 may be similar to those of the insulating layer 760, and the details are not described again herein to avoid repetition.

Figure 7A:
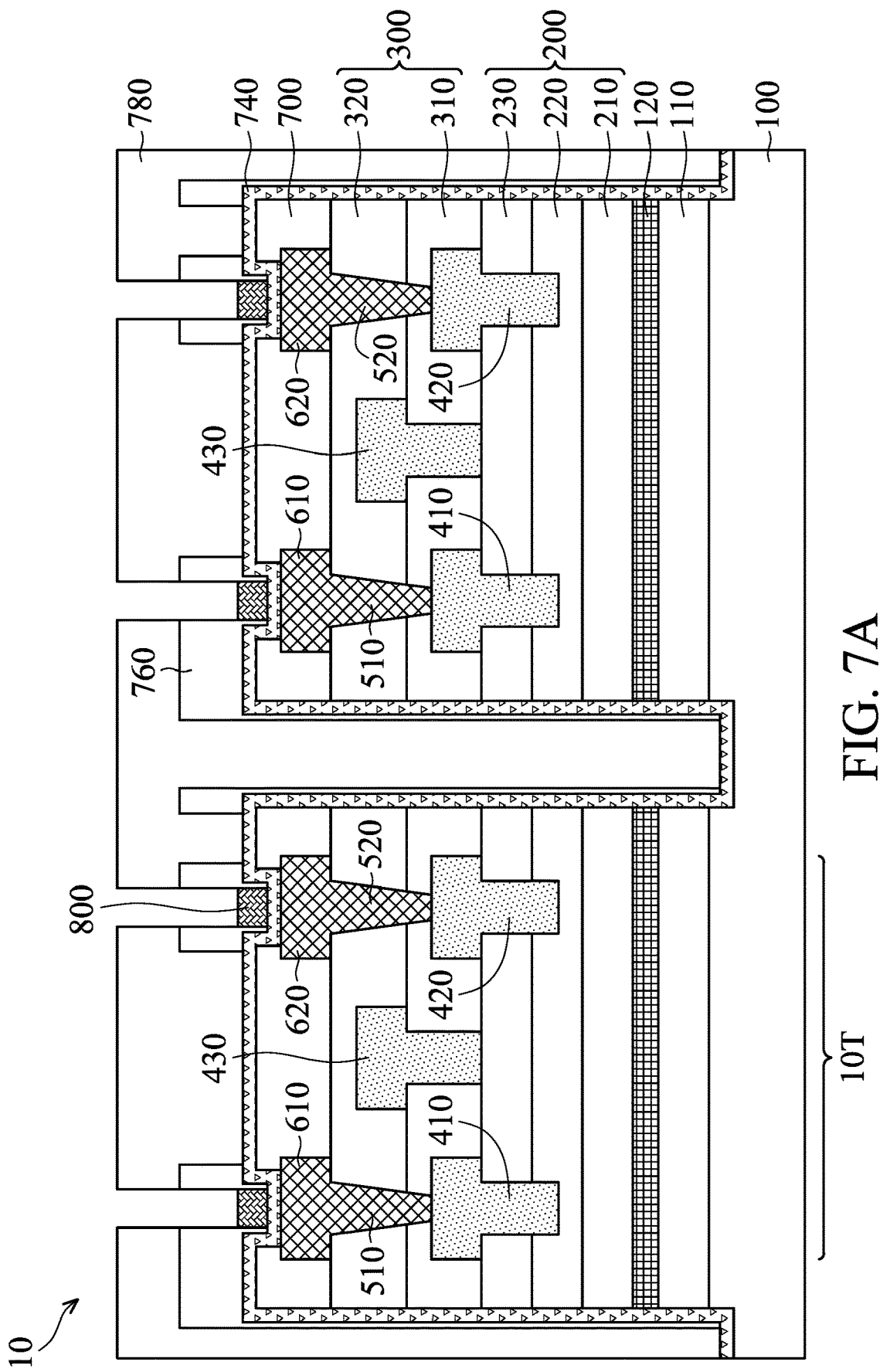
Figure 7B:
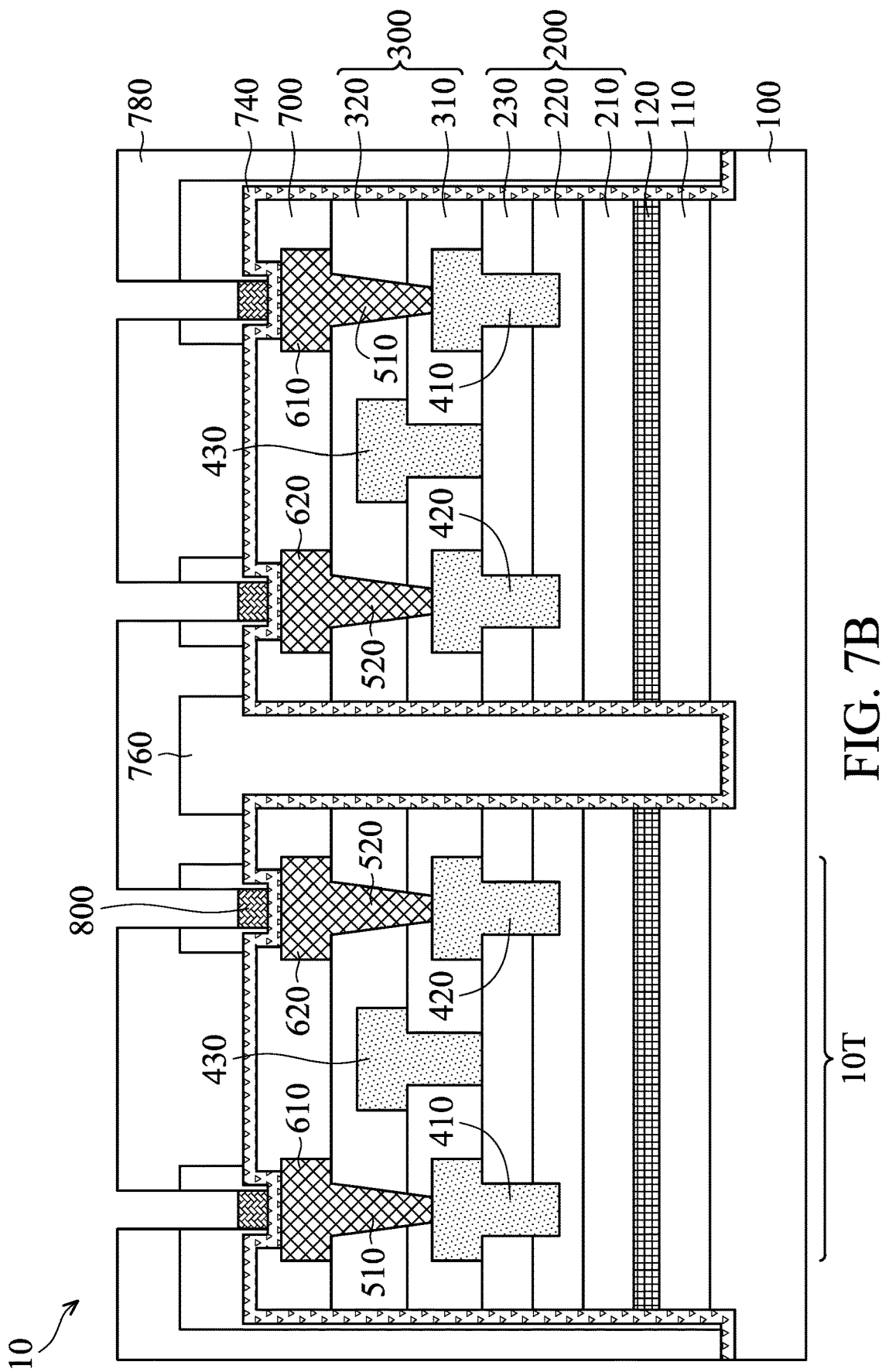

Referring to FIGS. 7A and 7B, the bonding pads 800 may be formed in the photoresist opening 784. The bonding pads 800 cover the portions of the conductive layer 740 exposed through the photoresist opening 784 (or the second opening 764). In other words, the bonding pads 800 are disposed on the portions of the conductive layer 740 located at the top surface of the source metal layer 610 and the top surface of the drain metal layer 620. Since the principle of the present disclosure is to electrically connect the seed layer 120 and the source metal layer 610 through the conductive layer 740, thus the conductive layer 740 needs to remain on the top surface of the source metal layer 610.

Typically, materials of the source metal layer 610 and the drain metal layer 620 may include nickel, gold, platinum (Pt), palladium (Pd), iridium (Ir), titanium, chromium (Cr), tungsten, aluminum, copper, a combination thereof, or other suitable materials. In a specific embodiment of the present disclosure, materials of the bonding pads 800 may include copper, nickel, and gold, so either the soldering wires or the soldering balls may be disposed on the bonding pads 800 during the package process of the package apparatus 1000 of the semiconductor device 10. The bonding pads 800 over the conductive layer 740 on the source metal layer 610 and the drain metal layer 620 may be obtained by conformally depositing a metal material layer on the photoresist layer 780 and in the photoresist opening 784 (corresponding the second opening 764), followed by simultaneously removing the photoresist layer 780 and the portion of the metal material layer located on it. The deposition of the bonding pads 800 may be similar to that of the source metal layer 610 and the drain metal layer 620, and the details are not described again herein to avoid repetition.

Figure 8A:
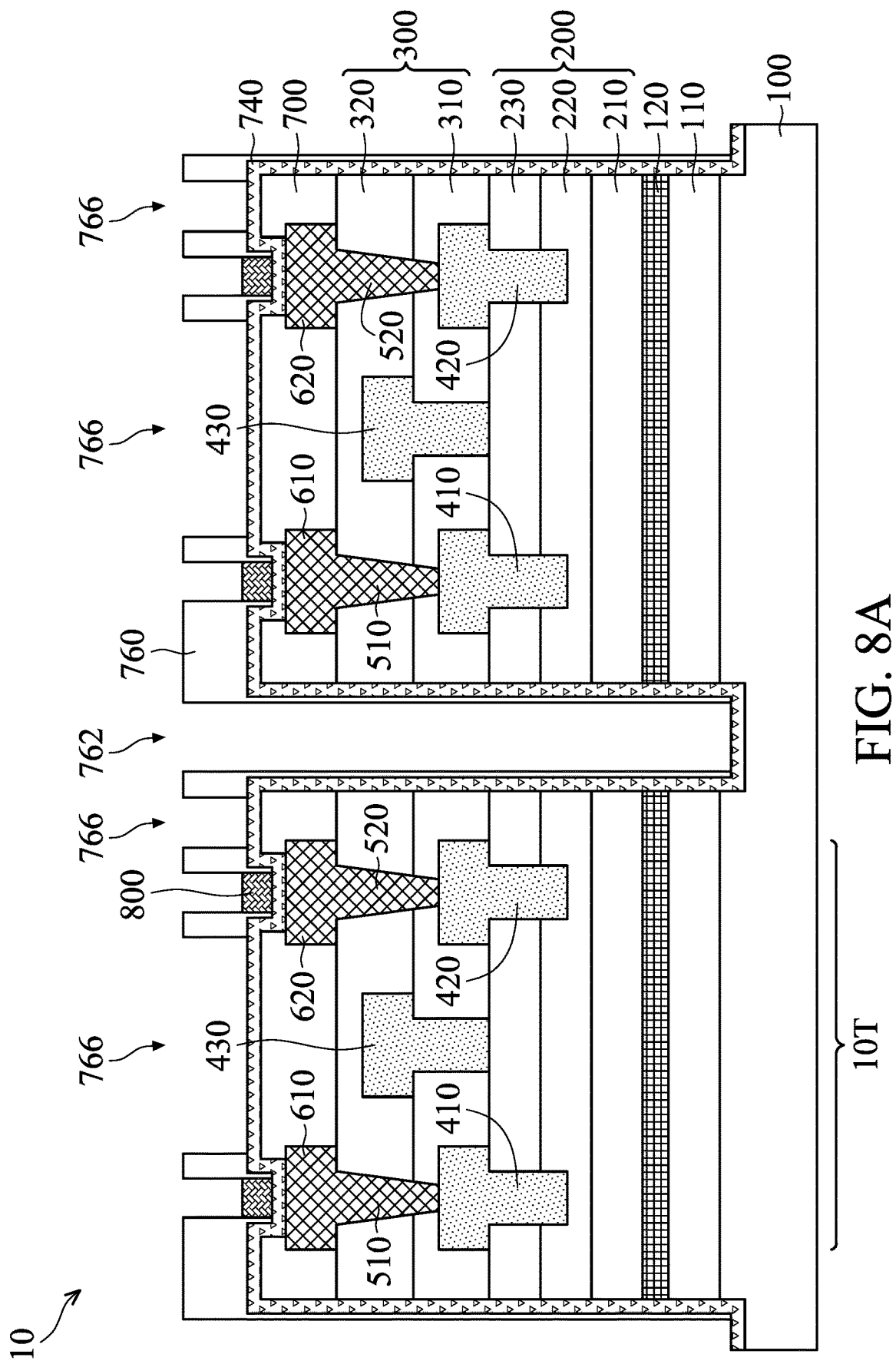
Figure 8B:
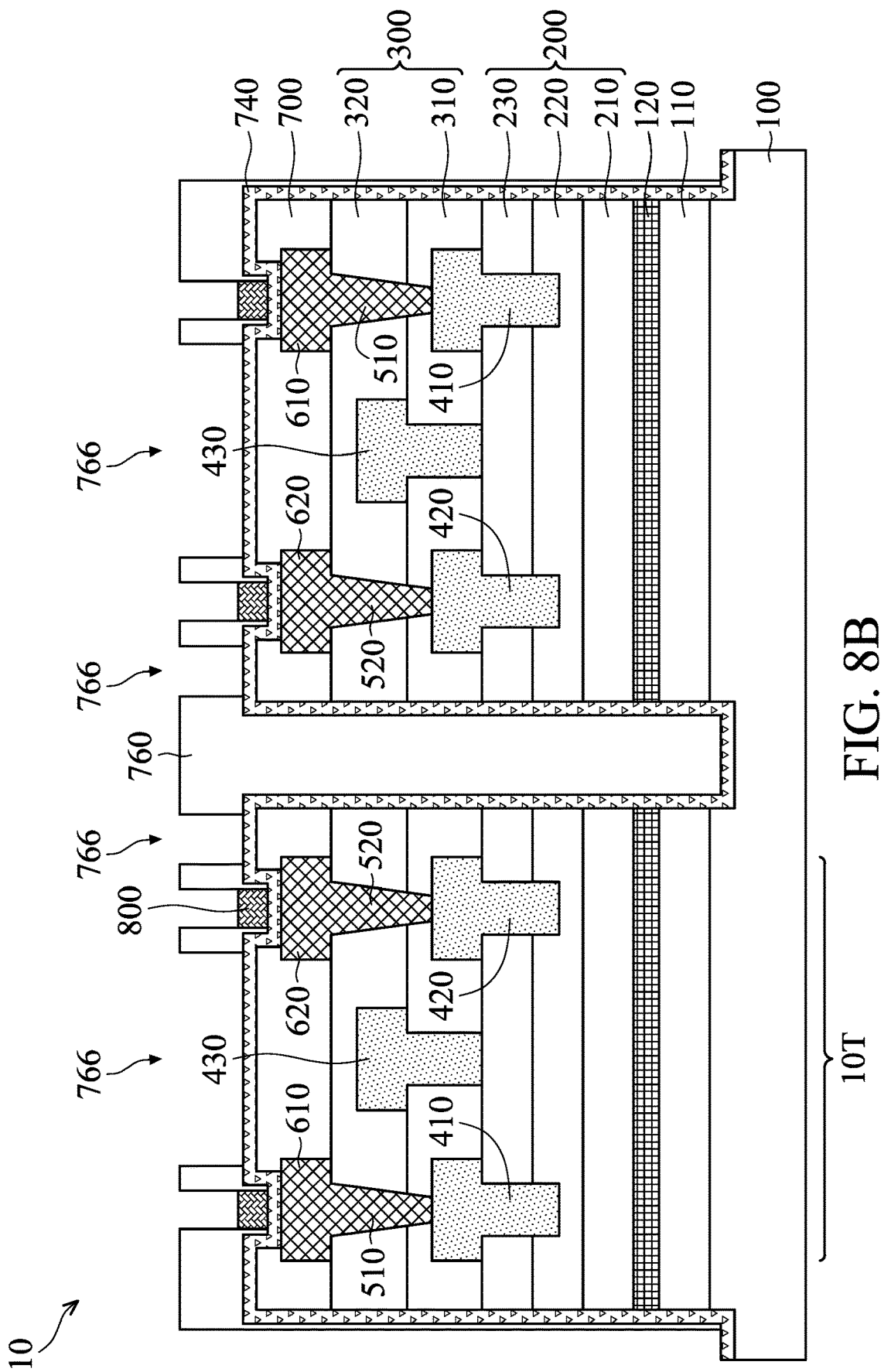

Referring to FIGS. 8A and 8B, the photoresist layer 780 may be removed after the bonding pads 800 are formed. After the photoresist layer 780 is removed, the first opening 762 and the third opening 766 (referring to FIG. 5A) may be exposed, or only the third opening 766 (referring to FIG. 5B) may be exposed. It should be noted that, the original portions of the conductive layer 740 exposed by the second opening 764 in FIG. 5A or in FIG. 5B have been covered by the bonding pads 800. The patterned photoresist layer 780 may be removed by ashing, stripping, the like, or a combination thereof.

Figure 9A:
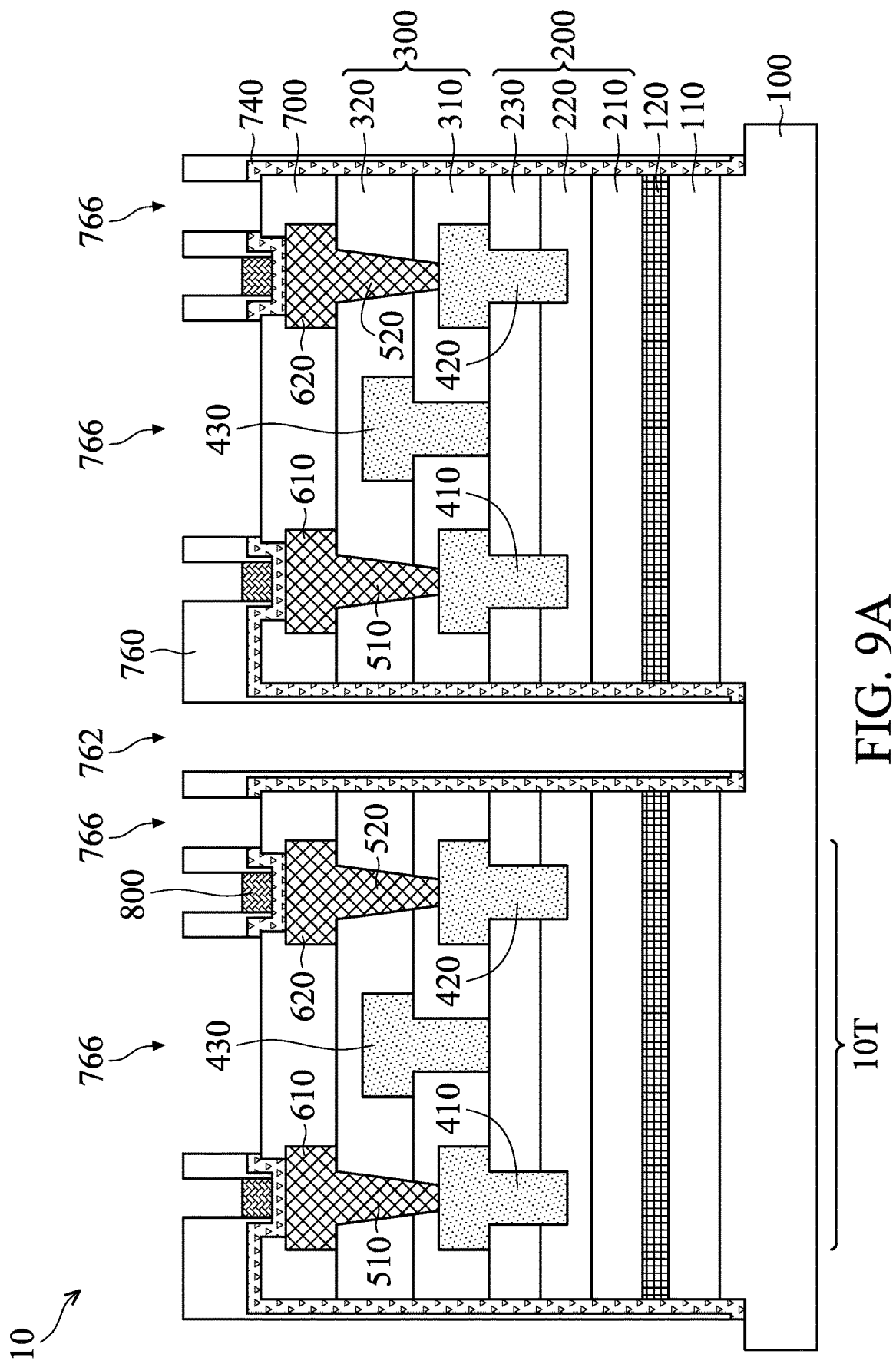
Figure 9B:
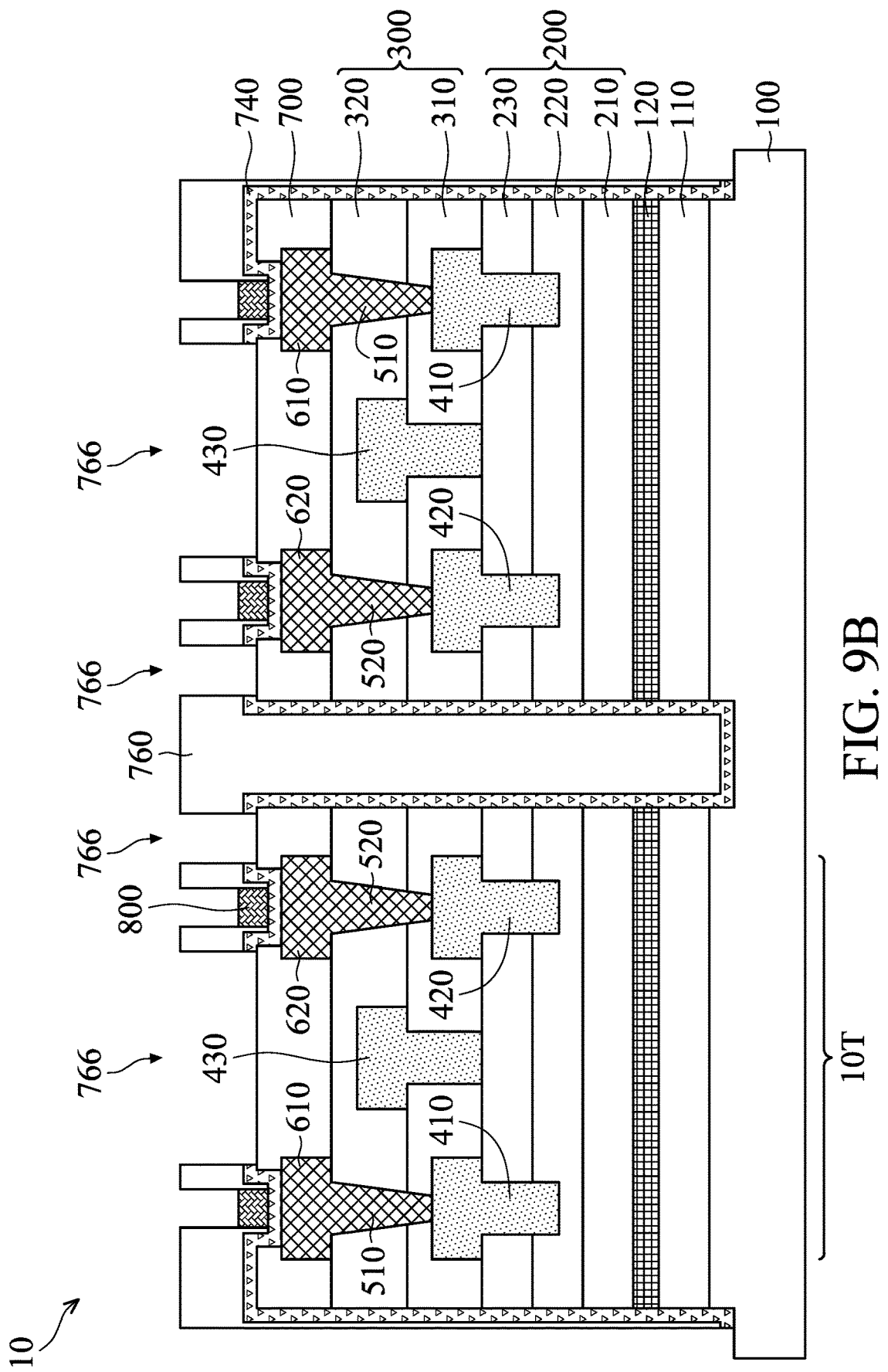

Referring to FIGS. 9A and 9B, the portions of the conductive layer 740 not protected by the insulating layer 760 and the bonding pads 800 are removed. In other words, the portions of the continuous conductive layer 740 exposed by the first opening 762 and the third opening 766 of FIG. 8A are cut off, or the portions of the continuous conductive layer 740 exposed by the third opening 766 of FIG. 8B is cut off, in order to prevent short circuitry of the semiconductor device 10 in the subsequent operation. As shown in FIG. 9A, when the portion of the conductive layer 740 exposed by the first opening 762 is cut off, the two neighboring transistors 10T may not be in conduction. When the portions of the conductive layer exposed by the third opening 766 is cut off, the source metal layer 610 and the drain metal layer 620 may not be in conduction, and the seed layer 120 and the drain metal layer 620 may not be in conduction, either. As shown in FIG. 9B, when the portions of the conductive layer 740 exposed by the third opening 766 is cut off, the source metal layer 610 and the drain metal layer 620 of each transistor 10T may not be in conduction, and the seed layer 120 and the drain metal layer 620 may not be in conduction, either. In addition, the drain metal layer 620 of the two transistors 10T may not be in conduction, but the two transistors 10T may remain connected with each other in series. Therefore, cutting off the aforementioned portions of the conductive layer 740 may effectively prevent short circuitry of the semiconductor device 10 in the subsequent operation. The continuous conductive layer 740 may be cut off by any suitable etching process (for example, a wet etch process).

Figure 10A:
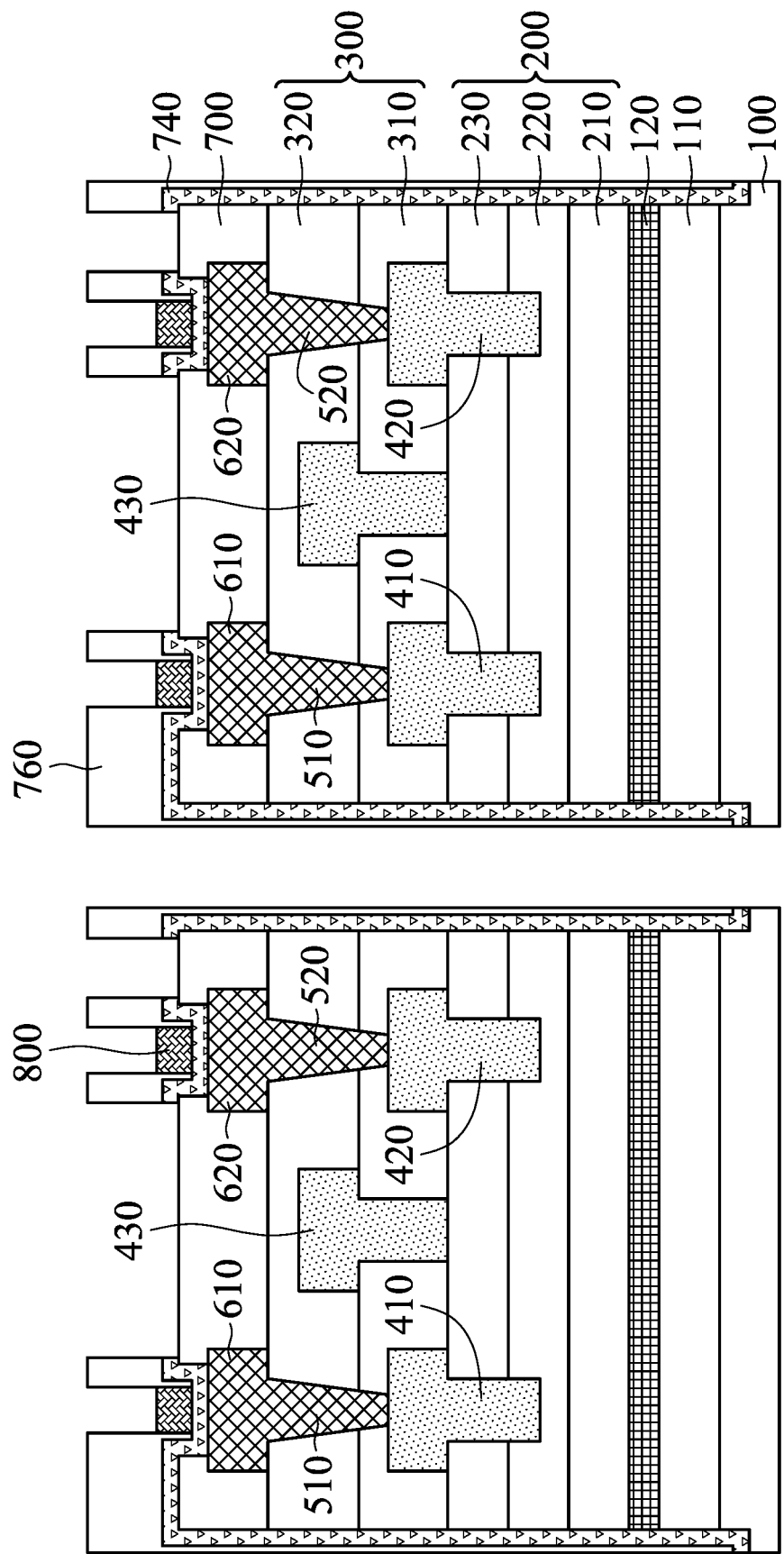
Figure 10B:
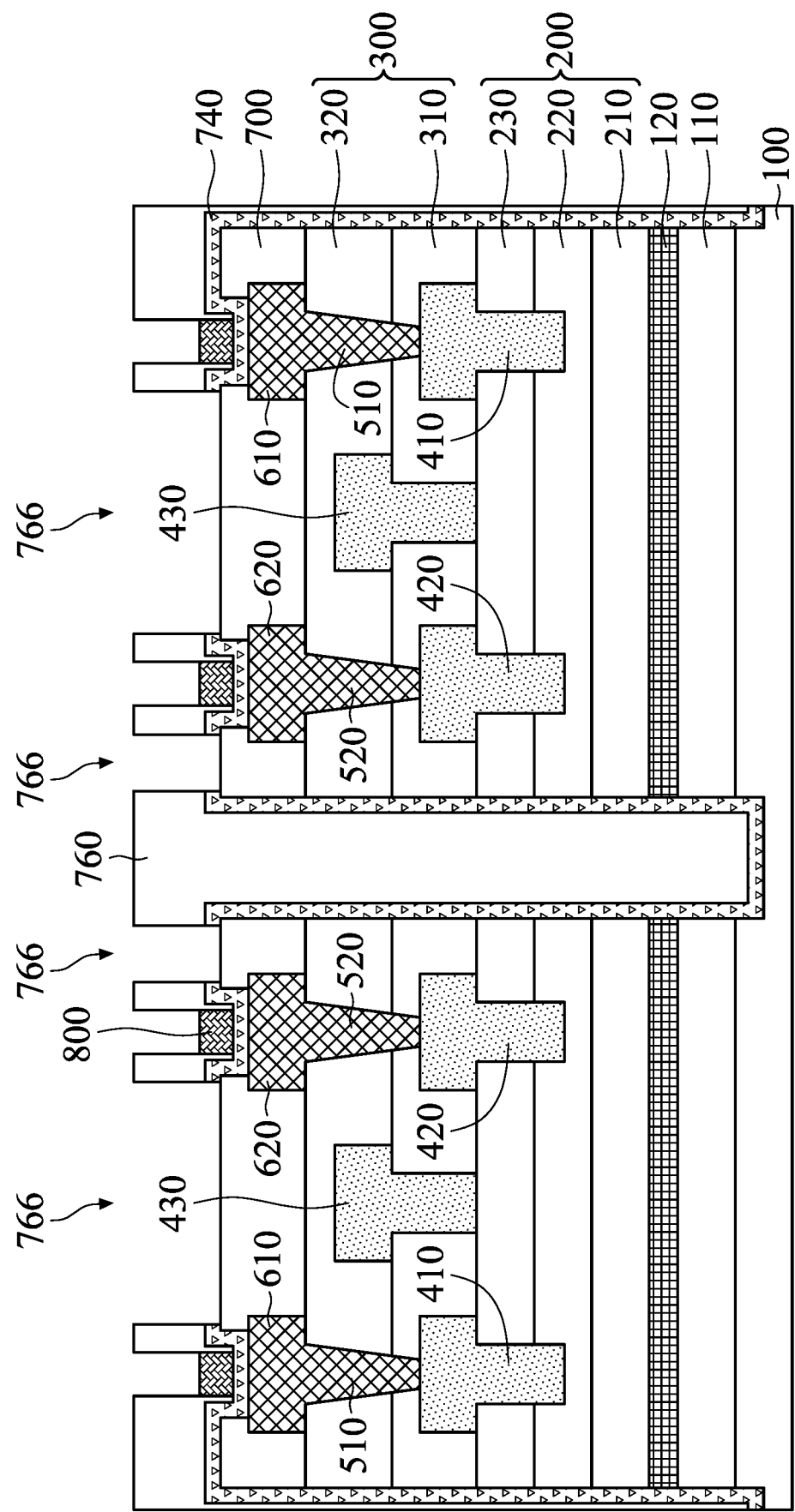

Referring to FIGS. 10A and 10B, after the conductive layer 740 is cut off, the substrate 100 may be thinned. Depending on application and design requirements, the substrate 100 may be grinded to the requirement thickness from the backside (another side opposite from the seed layer 120) of the substrate 100. The substrate 100 may be thinned by Taiko grinding process, Non-Taiko grinding process, or the like. As shown in FIG. 10A, since the two transistors 10T are active components that operate independently from each other, a singulation process may need to be additionally performed on the thinned substrate 100. Since the partial laser dicing has already be performed previously on the predetermined position to be singulated from the frontside of the substrate 100, only the remaining portion of grinded substrate 100 needs to be diced. It is worth noted that, the two transistors 10T in FIG. 10B are connected with each other in series, thus it is not required to perform the singulation process on the thinned substrate 100. The singulation process of the semiconductor device 10 in FIG. 10A may be performed using a blade saw, die break dicing, or the like.

As mentioned previously, since the portions of the conductive layer 740 of the present disclosure are disposed on the top surface of the source metal layer 610 and on the top surface of the drain metal layer 620, the said portions of the conductive layer 740 are covered with the bonding pads 800 consisted of copper, nickel, and gold. The bonding pads 800 are disposed to enable the soldering balls and the soldering wires may both be used to bond the bonding pads 800 when the package process is performed. The suitable package process may be performed before or after the singulation process. The suitable types of the package process may include wafer level chip scale package (WLCSP), transistor outline (TO), small outline integrated circuit (SOIC), quad flat package (QFP), dual flat non-leaded (DFN), quad flat non-leaded (QFN), and ball grid array (BGA).

Figure 11A:
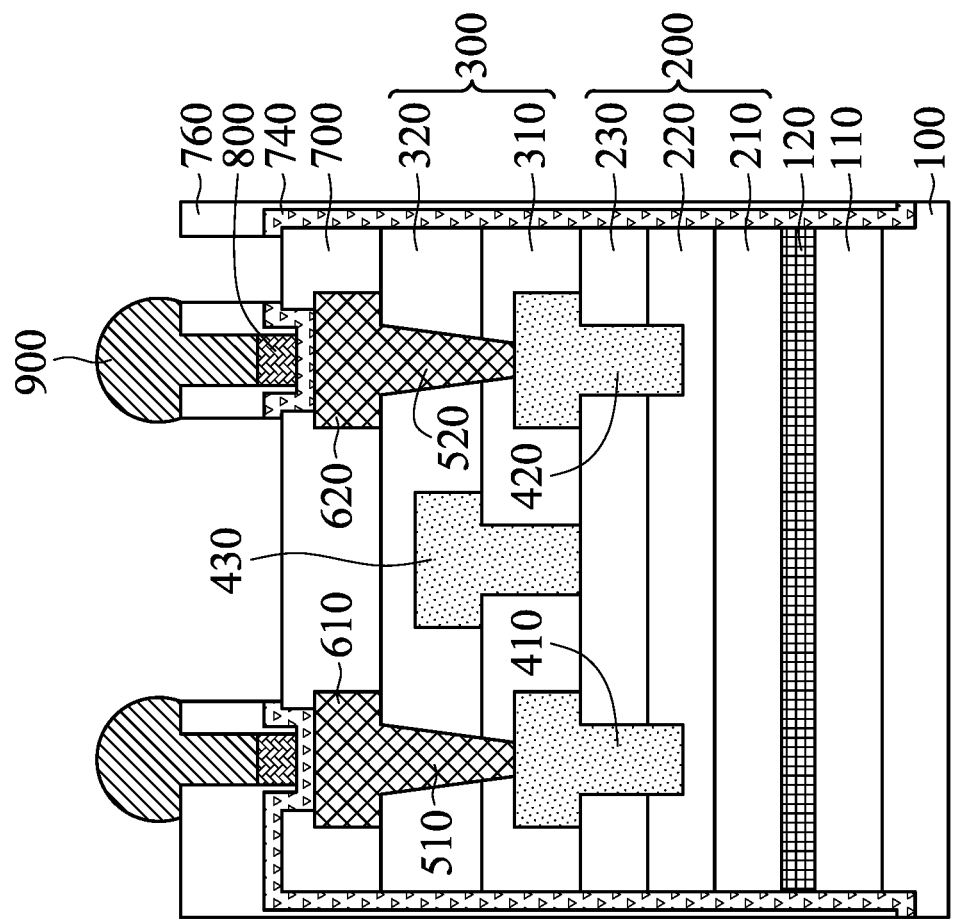
Figure 11B:
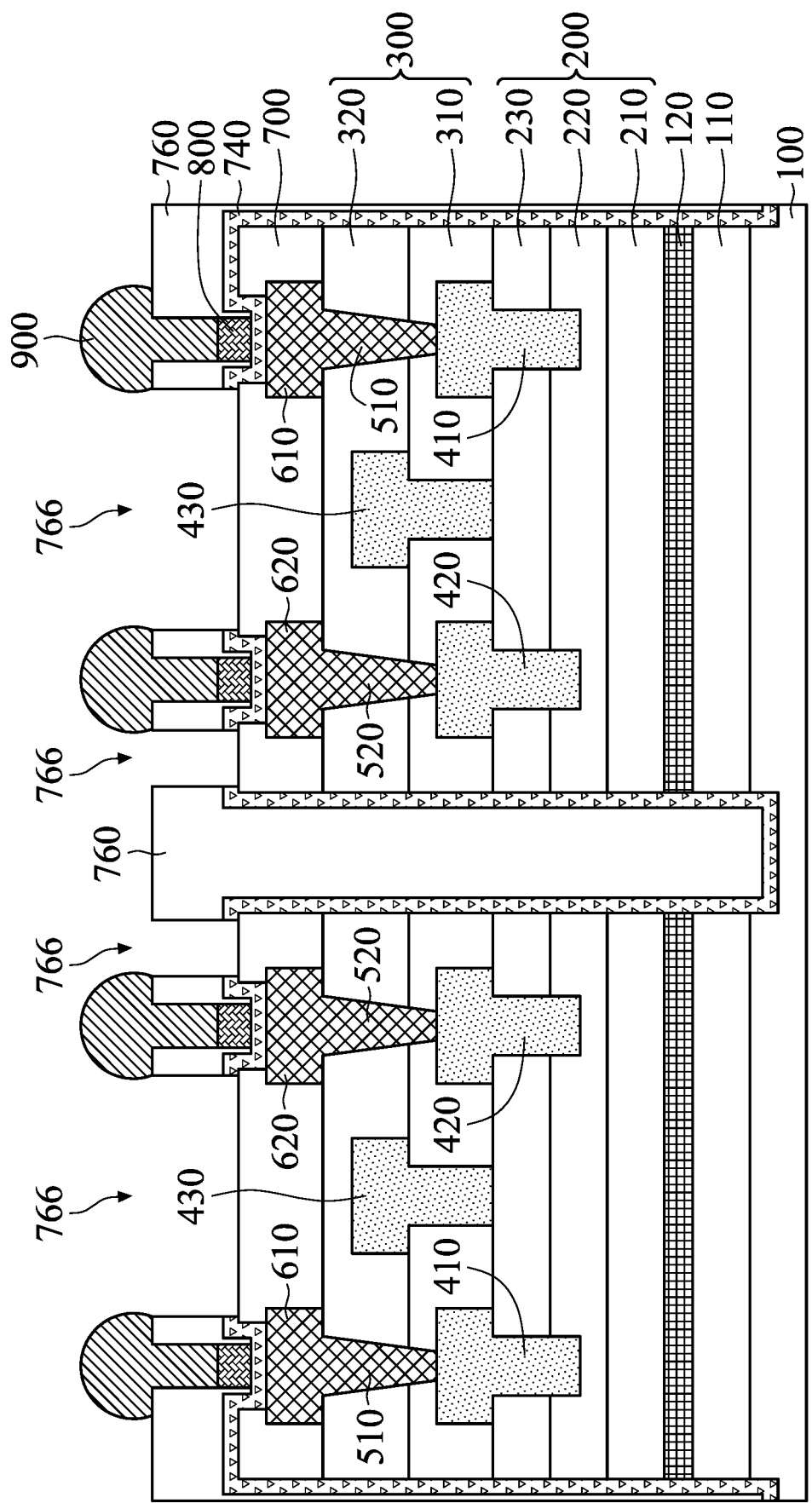

Referring to FIGS. 11A and 111B, solder balls 900 may be formed on the bonding pads 800 for the flip-chip type of the package process. In some embodiments, the solder balls 900 may also be referred as "solder bumps", which may be used to connect at least one singulated transistor 10T onto a package substrate 1100 (to be described in detail below) of the package apparatus 1000. The solder balls 900 may be thermally mounted onto the bonding pads 800 using the bonding machine, followed by performing a reflow process. After the reflow process, the diameter of the solder balls 900 located outside the insulating layer 760 may be approximately between 20 µm and 400 µm, for example, 45 µm. Materials of the solder balls 900 may include any suitable metal materials. In other embodiments, before the solder balls 900 are mounted, a barrier metal layer may first be formed on the bonding pads 800 to increase the bonding strength of the solder balls 900 and the bonding pads 800.

Figure 12A:
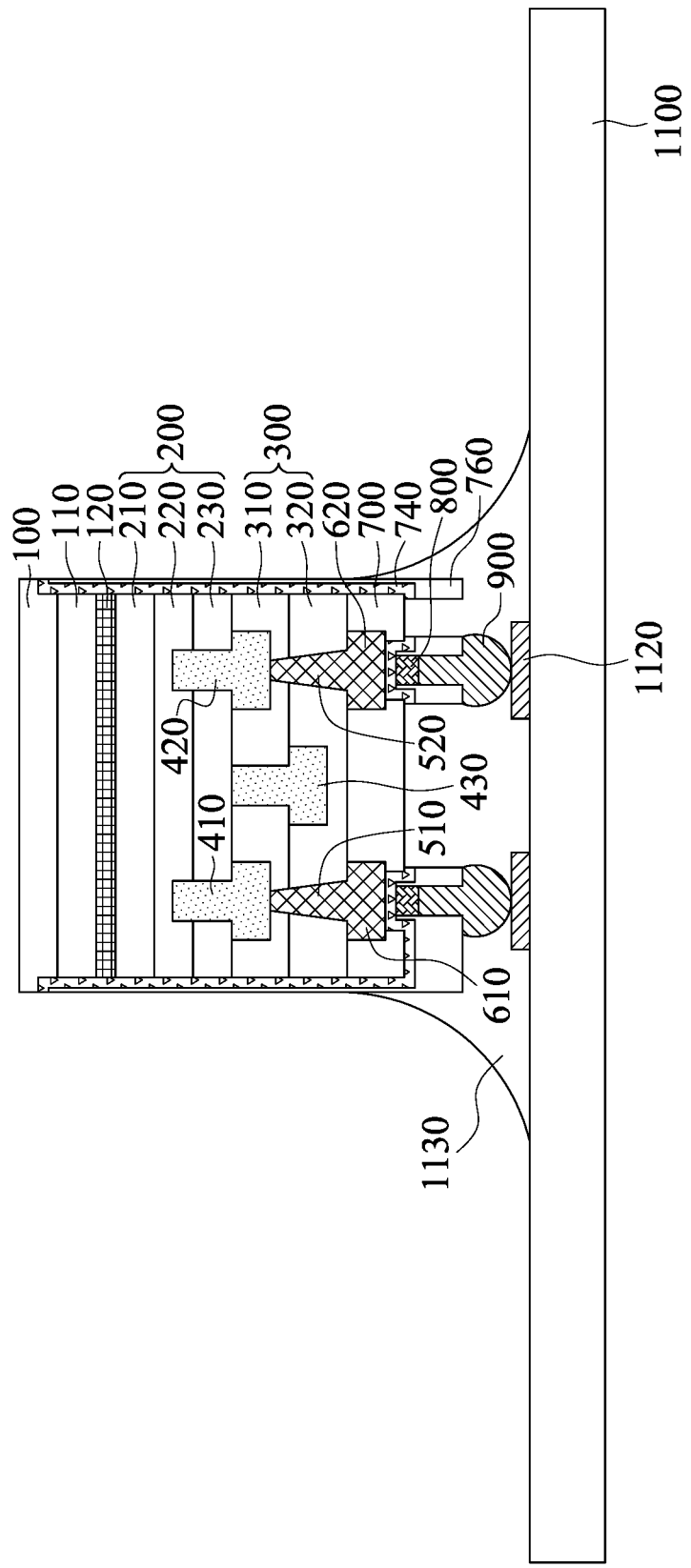
Figure 12B:
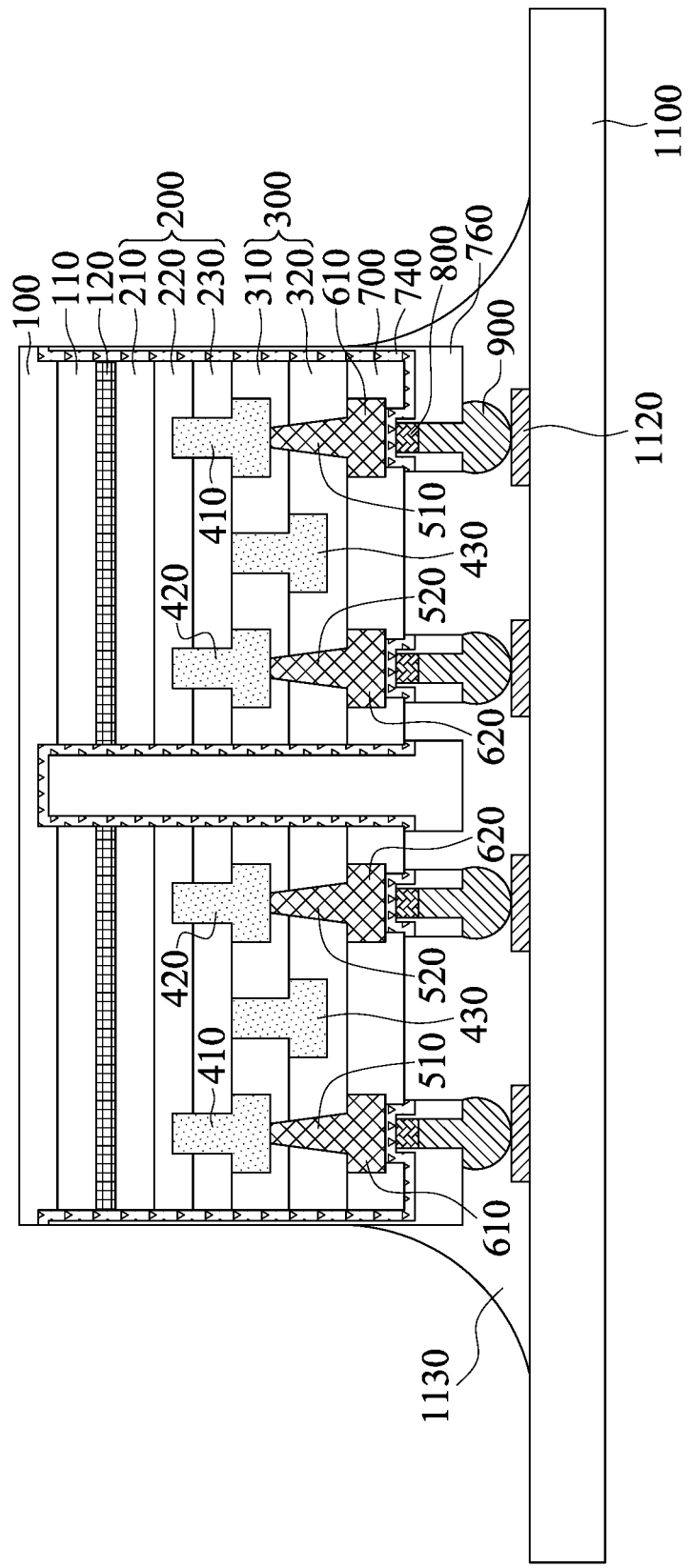

Referring to FIGS. 12A and 12B, the package substrate 1100 is provided. The package substrate 1100 may be a laminated substrate. For example, multiple metal layers and multiple dielectric layers may be alternately arranged within the package substrate 1100, with a via hole penetrating the dielectric layers to couple every metal layer. For simplicity, the details of the package substrate 1100 are not illustrated herein. In some embodiments, the upper surface of the package substrate 1100 may be used to connect the transistor 10T, while the lower surface is used to connect, for example, a printed circuit board (PCB). The outermost metal layer of the package substrate 1100 may be patterned to form soldering pads 1120 on the upper surface.

According to some embodiments of the present disclosure, the transistor 10T may be flip-chip connected to the package substrate 1100. That is, the transistor 10T may be "flipped" for the solder balls 900 to electrically connect to the soldering pads 1120. When the topmost portion of the transistor 10T does not include the bonding pads 800 consisted of copper, nickel, and gold, the transistor 10T and the package substrate 1100 needs to be connected through wire bonding with the soldering wires. However, the excessively long metal wires may increase the inductance between components. The transistor 10T of the present disclosure, having the bonding pads 800, may directly solder the solder balls 900 onto the soldering pads 1120. Since the wire bonding is omitted, the dimension of the transistor 10T and the configuration of the circuitry may have a higher flexibility, while the performance of the overall structure may be optimized. Such process may be referred as a surface mount technology (SMT).

Still referring to FIGS. 12A and 12B, an underfill 1130 may be injected into the space between the transistor 10T and the package substrate 1100. In some embodiments, the underfill 1130 may be in contact and may surround the solder balls 900. The underfill 1130 may be cured to further fix the transistor 10T and the solder balls 900 on the package substrate 1100. In some embodiments, the underfill 1130 may overflow beyond the space between the transistor 10T and the package substrate 1100, and may surround a portion of the peripheral sidewall of the transistor 10T to strengthen the stability of the transistor 10T. Materials of the underfill 1130 may include epoxy resin or silica gel. The underfill 1130 may be infiltrated into the space between the transistor 10T and the package substrate 100 by a dispensing method.

Figure 13A:
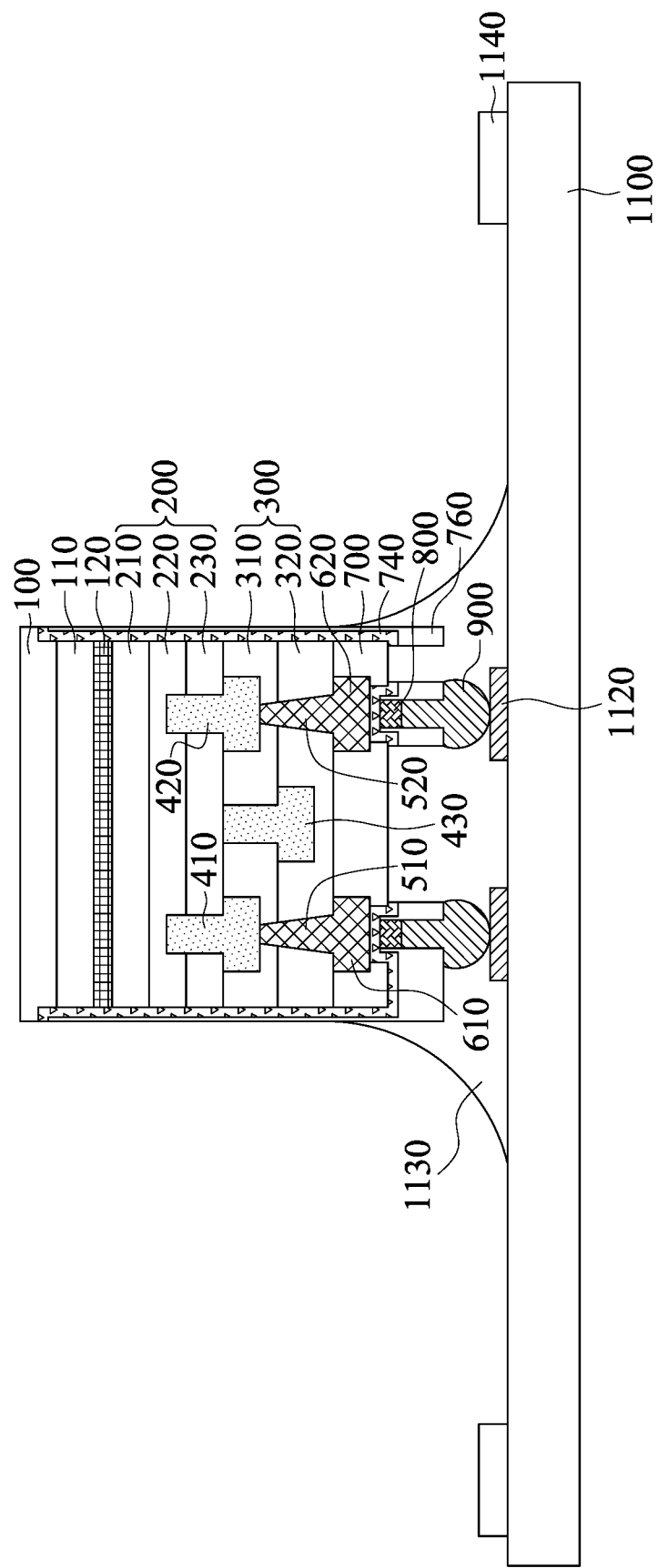
Figure 13B:
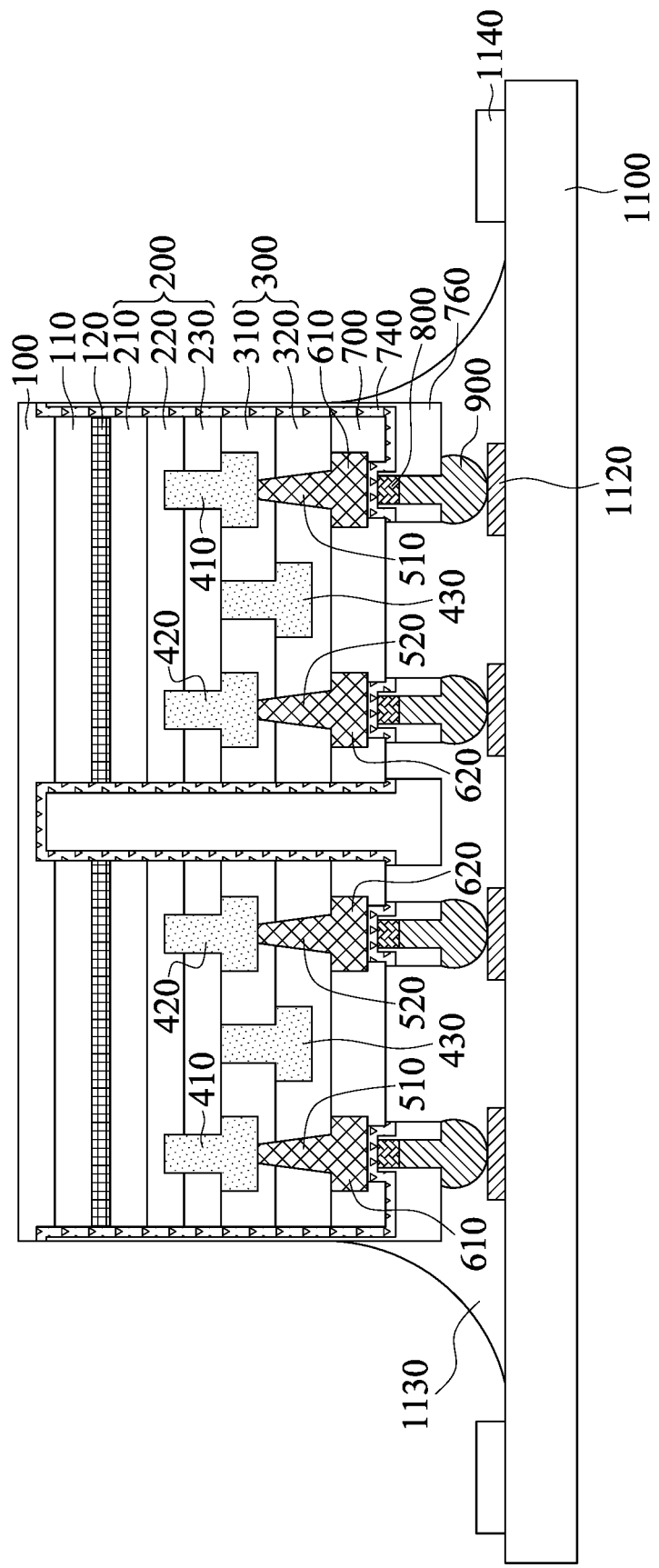

Referring to FIGS. 13A and 13B, a first glue layer 1140 may be formed on the package substrate 1100. From the top view, the first glue layer 1140 may have a ring structure that surrounds the transistor 10T (or the underfill 1130). It is worth noted that, the first glue layer 1140 and the transistor 10T are laterally spaced apart. According to some embodiments of the present disclosure, the first glue layer 1140 may be served to define the location of the subsequently formed stiffener ring structure 1160, and to increase the adhesion of the package substrate 1100 and the stiffener ring structure 1160.

Materials of the first glue layer 1140 may include bisphenol A type epoxy resin, bisphenol F type epoxy resin, bisphenol S type epoxy resin, phenol novolac type epoxy resin, alkylphenol novolac type epoxy resin, biphenyl type epoxy resin, aralkyl type epoxy resin, dicyclopentadiene type epoxy resin, naphthalene type epoxy resin, naphthol type epoxy resin, biphenyl aralkyl type epoxy resin, fluorene type epoxy resin, xanthene type epoxy resin, triglycidyl isocyanurate (TGIC), the like, or a combination thereof. The first glue layer 1140 may be formed with the dispensing method using a syringe printing process.

Figure 14A:
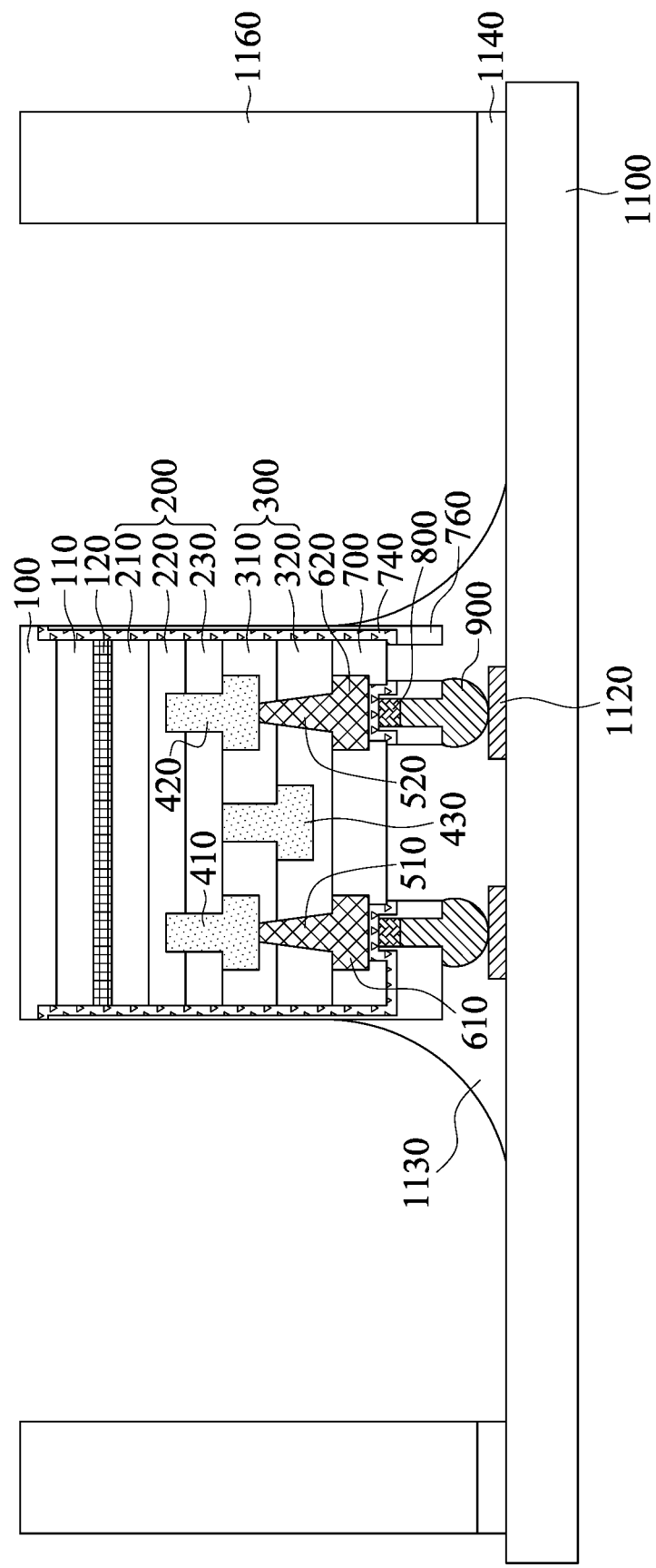
Figure 14B:
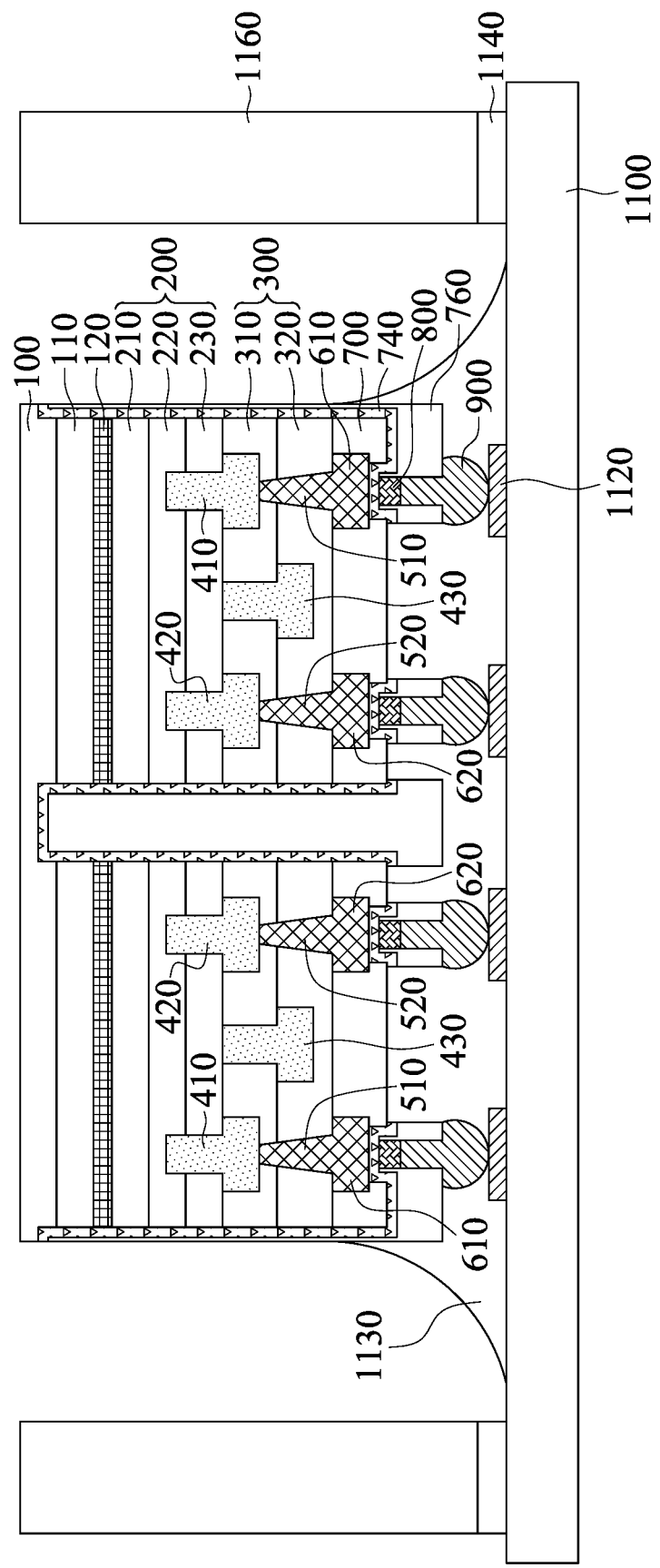

Referring to FIGS. 14A and 14B, the stiffener ring structure 1160 may be formed on the first glue layer 1140. From the top view, the stiffener ring structure 1160 may also have a ring structure surrounding the transistor 10T (or the underfill 1130). The ring structure may be circular, rectangular, or any acceptable geometrical shapes. The stiffener ring structure 1160 and the transistor 10T are laterally spaced apart. According to some embodiments of the present disclosure, the stiffener ring structure 1160 may support the space between the package substrate 1100 and the subsequently formed heat sink 1200, in order to prevent warpage on the structure of the package apparatus 1000. Materials of the stiffener ring structure 1160 may include ceramic, plastic, the like, or a combination thereof. The top surface of the stiffener ring structure 1160 may be substantially level with the backside (another surface opposite from the seed layer 120) of the substrate 100 of the transistor 10T. The stiffener ring structure 1160 may be formed using heat resistant glue, solder paste, the like, or a combination thereof, followed by a curing process.

Figure 15A:
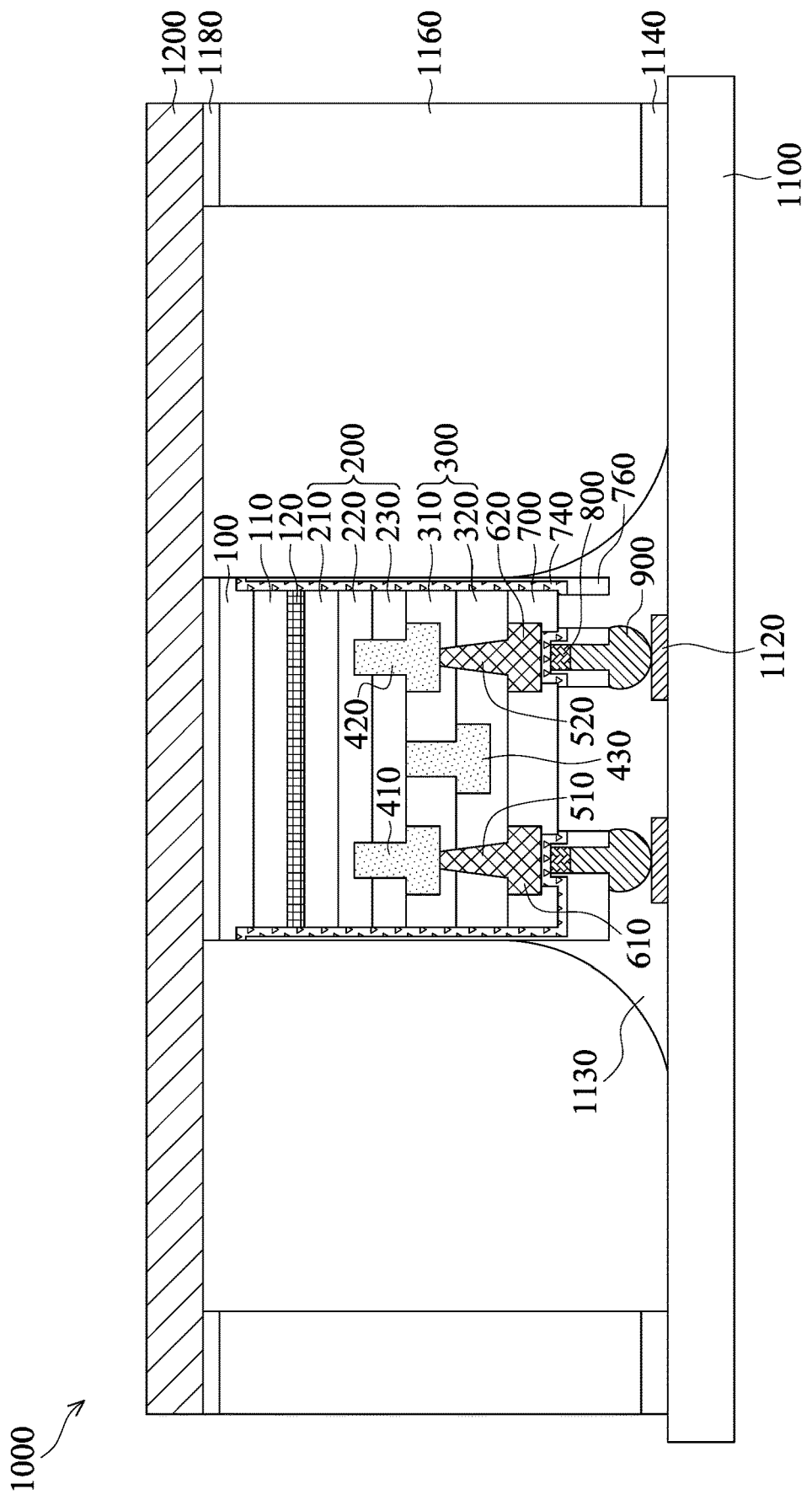
Figure 15B:
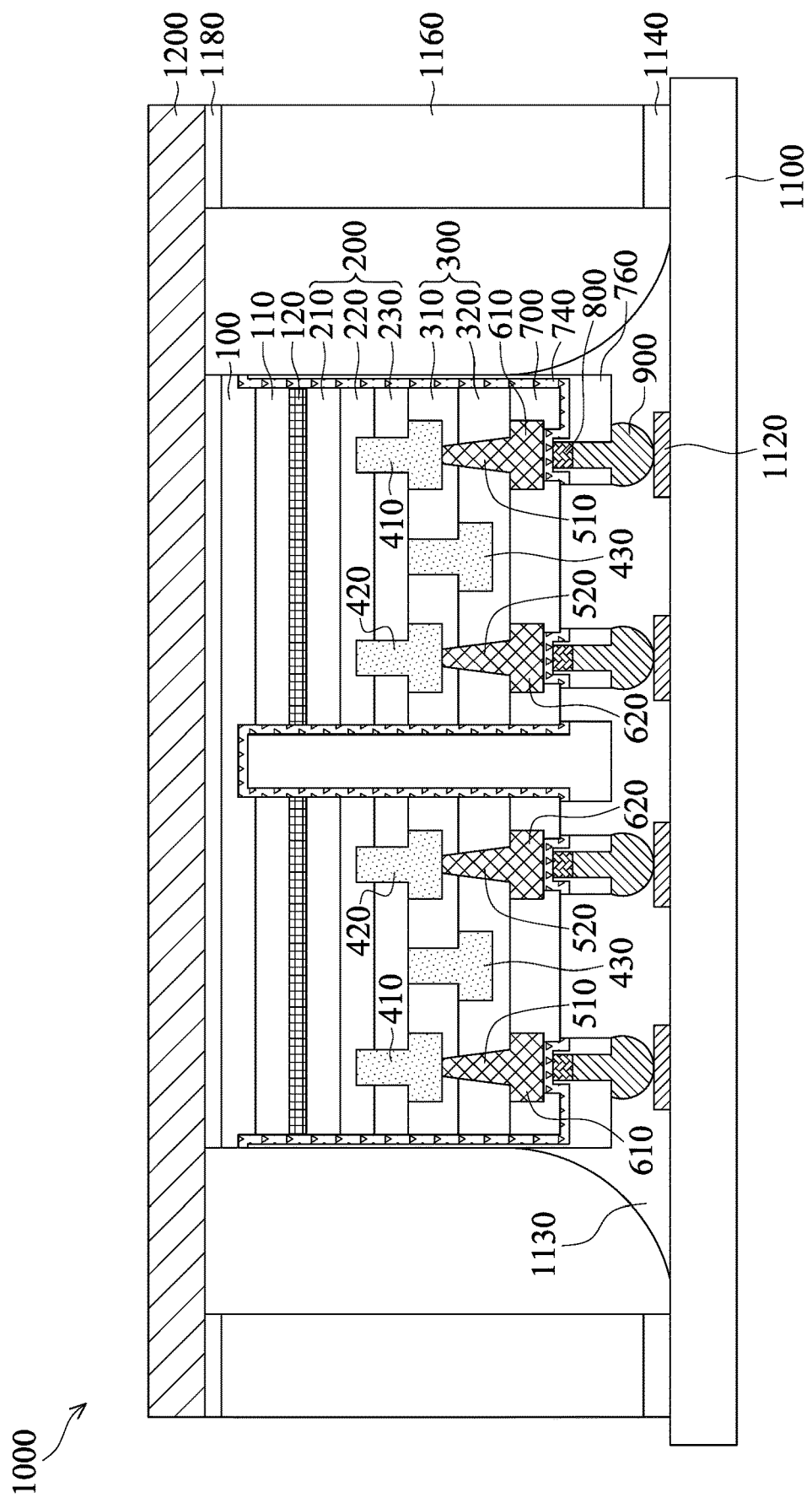

Referring to FIGS. 15A and 15B, a second glue layer 1180 and a heat sink 1200 may be sequentially formed on the top surface of the stiffener ring structure 1160 and on the backside of the substrate 100 of the transistor 10T. According to some embodiments of the present disclosure, the second glue layer 1180 may increase the adhesion of the stiffener ring structure 1160 and/or the transistor 10T with the heat sink 1200. Materials and the formation of the second glue layer 1180 may be similar to those of the first glue layer 1140, and the details are not described again herein to avoid repetition. In other embodiments, the second glue layer 1180 may include thermal conductive materials, which can assist the heat dissipation of the heat sink 1200.

According to some embodiments of the present disclosure, the heat sink 1200 may release the heat generated from the transistor 10T in operation, and may provide an additional heat dissipation path, so the heat dissipation efficiency may be more effectively enhanced. The thickness of the heat sink 1200 may be approximately between 0.05 mm and 5 mm, but the present disclosure is not limited thereto. Materials of the heat sink 1200 may include any materials with thermal conductivity, for example, graphene or metals. The heat sink 1200 may be deposited using physical vapor deposition (PVD), atomic layer deposition, plating, the like, or a combination thereof.

In a comparative example, the compound semiconductor stack layer 200 is penetrated using the etching process, followed by forming a through GaN via (TGV) to electrically connect the seed layer and the source metal layer as electrical ground, so the accumulated charges may be discharged. However, since etching the compound semiconductor stack layer 200 is difficult, forming the through GaN via requires very high cost and very long cycle time. Moreover, the energy required in the etching process is difficult to control, and the risk of damaging other components is relatively high. Therefore, the manufacture cost and risk of the process mentioned above can be evidently observed.

As the area and the thickness of the GaN-based structure increases, the material itself with the characteristics to readily accumulate charges has also became more apparent. The present disclosure employs a conductive layer, which conformally and continuously extends from the side surface of the seed layer to the top surface of the source metal layer, to discharge the accumulated charges within the seed layer, thereby lowering the device resistance and enhancing the device operation speed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method forming a semiconductor device, comprising:
    providing a substrate;
    forming a seed layer on the substrate;
    forming a compound semiconductor stack layer on the seed layer;
    forming a source metal layer and a drain metal layer on the compound semiconductor stack layer;
    performing a dicing process to form a dicing opening through the compound semiconductor stack layer and the seed layer, and extending into at least a portion of the substrate;
    conformally depositing a conductive layer on a bottom and sidewalls of the dicing opening, and covering the source metal layer and the drain metal layer; and
    removing a portion of the conductive layer located between the source metal layer and the drain metal layer.

2. The method of claim 1, further comprising removing a portion of the conductive layer located at the bottom of the dicing opening.

3. The method of claim 1, further comprising removing a portion of the conductive layer located between the drain metal layer and the dicing opening close to the drain metal layer.

4. The method of claim 1, further comprising forming an insulating layer covering the source metal layer, the drain metal layer, and filling the dicing opening before removing the portion of the conductive layer.

5. The method of claim 4, further comprising patterning the insulating layer to form a first opening and a second opening, wherein:
    the first opening exposes the portion of the conductive layer located between the source metal layer and the drain metal layer, and exposes a portion of the conductive layer located between the drain metal layer and the dicing opening close to the drain metal layer; and
    the second opening exposes portions of the conductive layer located at a top surface of the source metal layer and a top surface of the drain metal layer.

6. The method of anyone of claim 5, further comprising forming a bonding pad in the second opening, and the bonding pad is disposed on the portions of the conductive layer exposed by the second opening.

7. The method of claim 6, further comprising coating a photoresist layer on the insulating layer, followed by patterning the photoresist layer to form a photoresist opening corresponding the second opening before forming the bonding pad.

8. The method of claim 1, wherein depositing the conductive layer comprising using a sputtering process and an evaporating process.

9. The method of claim 1, wherein removing the portion of the conductive layer comprising using a wet etch process.

10. The method of claim 1, further comprising:
    thinning the substrate after removing the portion of the conductive layer; and
    performing a singulation process on a portion of the thinned substrate located under the dicing opening.

11. The method of claim 10, wherein thinning the substrate comprising using a Taiko grinding process or a Non-Taiko grinding process, and the singulation process comprising a blade saw or a die break dicing.

12. The method of claim 6, further comprising performing a package process, comprising:
    forming a solder ball on the bonding pad;
    flip-chip connecting the solder ball to a package substrate;
    forming a heat sink on a side of the substrate opposite from the seed layer; and forming a stiffener ring structure supporting a space between the package substrate and the heat sink.

* * * * *